US012757389B2

(12) United States Patent
Chiu

(10) Patent No.: US 12,757,389 B2
(45) Date of Patent: Oct. 6, 2026

(54) SEMICONDUCTOR DEVICE STRUCTURE INCLUDING FUSE STRUCTURE EMBEDDED IN SUBSTRATE

(71) Applicant: NANYA TECHNOLOGY CORPORATION, New Taipei City (TW)

(72) Inventor: Hsih-Yang Chiu, Taoyuan City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 411 days.

(21) Appl. No.: 18/217,717

(22) Filed: Jul. 3, 2023

(65) Prior Publication Data

US 2025/0017000 A1 Jan. 9, 2025

(51) Int. Cl.
*H10B 20/25* (2023.01)
*H10W 20/49* (2026.01)

(52) U.S. Cl.
CPC .......... *H10B 20/25* (2023.02); *H10W 20/493* (2026.01)

(58) Field of Classification Search
CPC ............................... H10B 20/25; H10D 64/513
See application file for complete search history.

(56) References Cited

U.S. PATENT DOCUMENTS

2007/0077713 A1* 4/2007 Ha ....................... H10B 12/053 257/E29.267
2015/0236154 A1* 8/2015 Park ..................... H10D 64/513 257/331
2017/0170116 A1* 6/2017 He ......................... G11C 17/16
2018/0166382 A1* 6/2018 Lee ........................ G11C 17/16
2020/0075610 A1* 3/2020 Wu ........................ G11C 17/16
2022/0367490 A1 11/2022 Chang et al.
2023/0187397 A1 6/2023 Or-Bach et al.
2023/0189538 A1 6/2023 Or-Bach et al.

FOREIGN PATENT DOCUMENTS

KR 20060009417 A * 1/2006 .......... H10W 20/494
TW 201620044 A 6/2016
TW 202046483 A 12/2020
TW 202221717 A 6/2022
TW 202312176 A 3/2023
TW 202314725 A 4/2023
TW 202324425 A 6/2023

OTHER PUBLICATIONS

Translation for KR-20060009417-A (Year: 2006).*
Office Action and search report mailed on Oct. 23, 2024 related to Taiwanese Application No. 113112591.
Office Action and search report mailed on Mar. 14, 2024 related to Taiwanese Application No. 112130127.

* cited by examiner

*Primary Examiner* — Aaron J Gray
(74) *Attorney, Agent, or Firm* — Xuan Zhang

(57) ABSTRACT

A semiconductor device structure and a method of manufacturing the same are provided. The semiconductor device structure includes a substrate, a fuse structure, and a first word line. The fuse structure includes a fuse electrode disposed within the substrate. The first word line is electrically coupled to the fuse structure. The first word line is disposed within the substrate and spaced apart from the fuse electrode of the fuse structure. The fuse electrode has a lateral surface protruding toward the first word line.

11 Claims, 26 Drawing Sheets

SEMICONDUCTOR DEVICE STRUCTURE INCLUDING FUSE STRUCTURE EMBEDDED IN SUBSTRATE

TECHNICAL FIELD

The present disclosure relates to a semiconductor device structure and a method of manufacturing the same, in particularly to a semiconductor device structure including a fuse structure embedded within a substrate.

Discussion of the Background

Many integrated circuits (ICs) are made up of millions of interconnected devices, such as transistors, resistors, capacitors, and diodes, on a single chip of a semiconductor substrate. It is generally desirable that ICs operate as fast as possible, and consume as little power as possible. Semiconductor ICs often include one or more types of memory, such as complementary metal-oxide-semiconductor (CMOS) memory, antifuse memory, and efuse memory.

EFuses are usually integrated into semiconductor ICs by a semiconductor material (e.g., a polysilicon or a metallization layer) disposed on a dielectric layer (e.g., silicon oxide). A programing current is applied to blow the dielectric layer, thus changing the resistivity of the eFuse. This is referred to as "programming" the eFuse. However, such structure requires a relatively large breakdown voltage, which may adversely affect the performance of a semiconductor device. Further, conventional eFuse structures occupies a relatively large space over the substrate, reducing the densities of ICs.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor device structure. The semiconductor device structure includes a substrate, a fuse structure, and a first word line. The fuse structure includes a fuse electrode disposed within the substrate. The first word line is electrically coupled to the fuse structure. The first word line is disposed within the substrate and spaced apart from the fuse electrode of the fuse structure. The fuse electrode has a lateral surface protruding toward the first word line.

Another aspect of the present disclosure provides a semiconductor device structure. The semiconductor device structure includes a substrate, a fuse structure, and a first word line. The fuse structure includes a fuse electrode disposed within the substrate. The first word line is electrically coupled to the fuse structure. A distance between the fuse electrode of the fuse structure and the first word line varies along a direction far away from the substrate.

Another aspect of the present disclosure provides a method for manufacturing a semiconductor device structure. The method includes: providing a substrate; forming a first word line and a second word line within the substrate; forming an opening extending from an upper surface of the substrate and between the first word line and the second word line; and forming an insulation layer within the opening; and forming a metallization layer over the insulation layer to define a fuse structure.

The embodiments of the present disclosure provide a semiconductor device structure. The semiconductor device structure includes a substrate, a fuse structure, a first word line, and a second word line. The first word line is electrically coupled with the fuse structure. Further, the first word line and the second word line are electrically coupled in parallel. As a result, a relatively large driving current can be generated. The fuse electrode of the fuse structure has a lateral surface protruded toward the first word line and the second word line. The semiconductor device structure can have a relatively small resistance between the fuse structure and the first word line (or the second word line). Accordingly, the fuse structure can be blown out with a smaller voltage.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
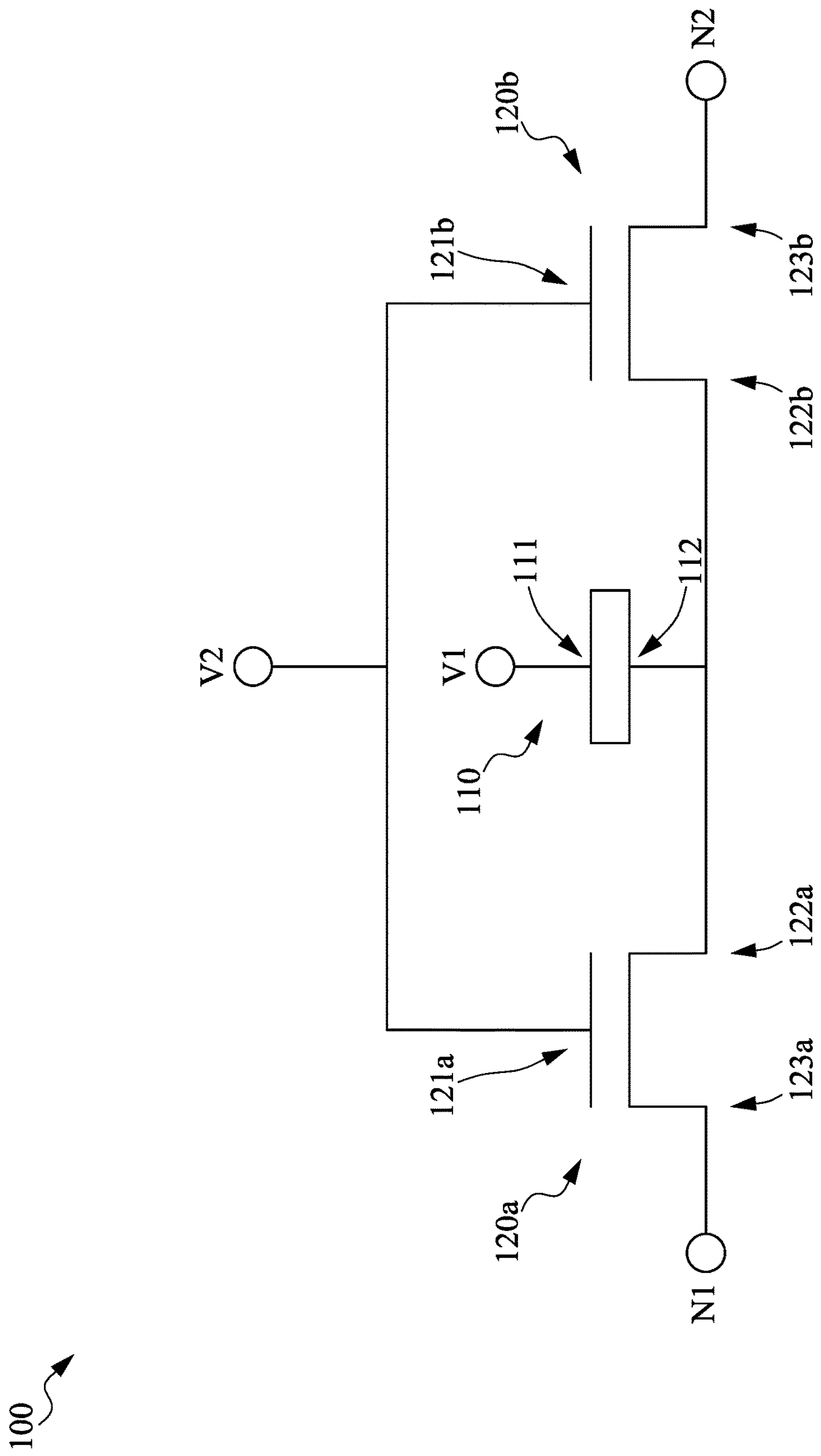
FIG. 1 is a schematic diagram of a circuit, in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that when an element is referred to as being "connected to" or "coupled to" another element, the initial element may be directly connected to, or coupled to, another element, or to other intervening elements.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be noted that the term "about" modifying the quantity of an ingredient, component, or reactant of the present disclosure employed refers to variation in the numerical quantity that may occur, for example, through typical measuring and liquid handling procedures used for making concentrates or solutions. Furthermore, variation may occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. In yet another aspect, the term "about" means within 10, 9, 8, 7, 6, 5, 4, 3, 2, or 1% of the reported numerical value.

FIG. 1 is a schematic diagram of a circuit 100, in accordance with some embodiments of the present disclosure. In some embodiments, the circuit 100 may include a fuse 110, a transistor 120*a*, and a transistor 120*b*. In some embodiments, the circuit 100 may be included in a memory device or other suitable devices. The memory device may include, for example, a one-time programming (OTP) memory device, a dynamic random access memory (DRAM) device, a static random access memory (SRAM) device, or other suitable memory devices.

The fuse 110 may include a terminal 111 and a terminal 112. The terminal 111 may be electrically connected to a voltage V1, such as VDDQ. The terminal 112 may be electrically connected to the transistors 120*a* and 120*b*.

The transistor 120*a* may function as a switch to turn on and/or turn off the fuse 110. The transistor 120*a* may include a terminal 121*a*, a terminal 122*a*, and a terminal 123*a*. The terminal 121*a* may be electrically connected to a voltage V2. The terminal 122*a* may be electrically connected to the fuse 110. The terminal 123*a* may be electrically connected to a node N1, which may be electrically connected to a bit line or a voltage. In some embodiments, the terminal 123*a* may be electrically connected to ground.

The transistor 120*b* may function as a switch to turn on and/or turn off the fuse 110. The transistor 120*b* may include a terminal 121*b*, a terminal 122*b*, and a terminal 123*b*. The terminal 121*b* may be electrically connected to the voltage V2. The terminal 122*b* may be electrically connected to the fuse 110. The terminal 123*b* may be electrically connected to a node N2, which may be electrically connected to a bit line or a voltage. In some embodiments, the terminal 123*b* may be electrically connected to ground. In some embodiments, the transistors 120*a* and 120*b* may be electrically coupled in parallel.

In some embodiments, the circuit 100 may function as a programing unit. In some embodiments, when a relatively large voltage (e.g., 5V or higher) is imposed on the terminal 111, a relatively small voltage (e.g., 2V or lower) is imposed on the terminals 121*a* and 121*b*, and the terminals 123*a* and 123*b* are electrically connected to ground, the fuse 110 can be blown out. As a result, the resistance state of the circuit 100 is changed.

Figure 2A:
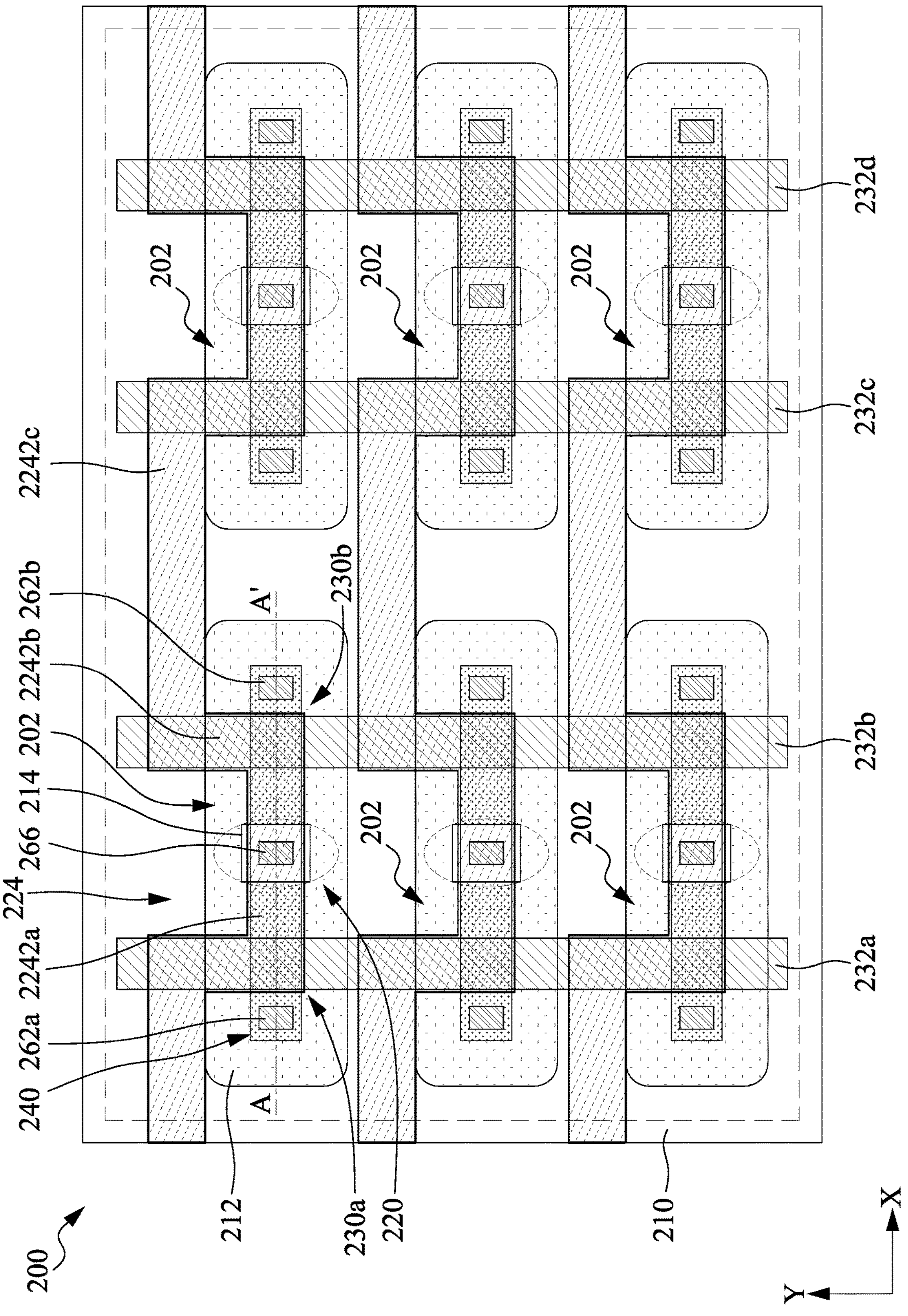
FIG. 2A is a top view of a semiconductor device structure, in accordance with some embodiments of the present disclosure.
Figure 2B:
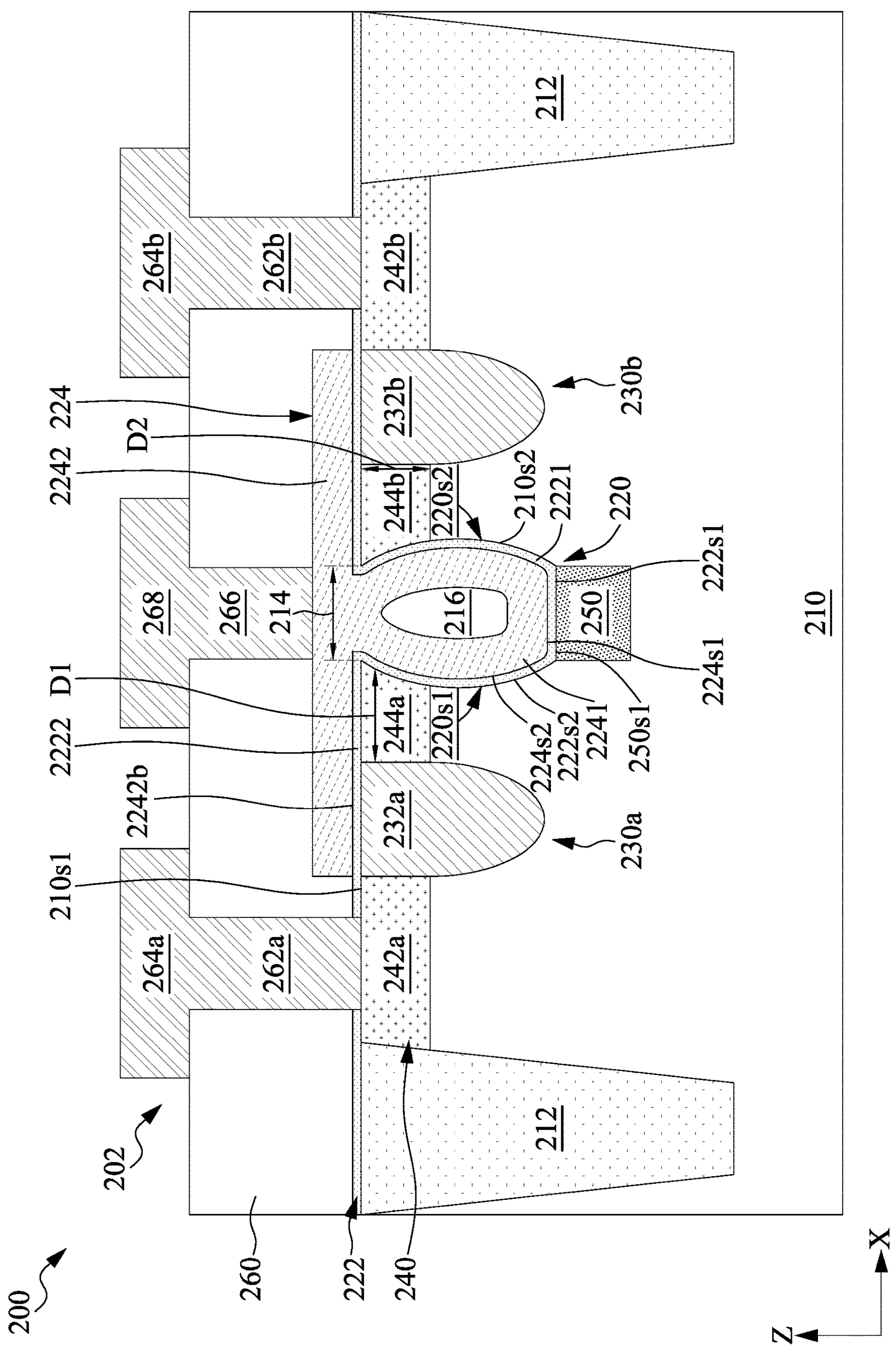
FIG. 2B is a cross-section along line A-A' of the semiconductor device structure as shown in FIG. 2A, in accordance with some embodiments of the present disclosure.

Referring to FIG. 2A and FIG. 2B, FIG. 2A is a top view of a semiconductor device structure 200, FIG. 2B is a cross-section along line A-A' of FIG. 2A.

As shown in FIG. 2A, the semiconductor device structure 200 may include a plurality of programming units 202, a substrate 210, and a plurality of isolation structures 212.

In some embodiments, each of the programming units 202 may be configured to enable the operation of the circuit 100 as shown in FIG. 1A. In some embodiments, each of the programming units 202 may be separated by the isolation structure 212. In some embodiments, each of the programming units 202 may include a fuse structure 220, a transistor 230*a*, and a transistor 230*b*. In some embodiments, the fuse structure 220 may correspond to the fuse 110 as shown in FIG. 1. In some embodiments, the transistors 230*a* and 230*b* may correspond to the transistors 120*a* and 120*b* as shown in FIG. 1.

The substrate 210 may define a plurality of openings 214. In some embodiments, the fuse structure 220 may be disposed within the opening 214, which will be described in FIG. 2B.

The semiconductor device structure 200 may include word lines 232*a*, 232*b*, 232*c*, and 232*d*. Each of the word lines 232*a*, 232*b*, 232*c*, and 232*d* may extend along the Y direction. The word lines 232*a*, 232*b*, 232*c*, and 232*d* may function as the terminal 121*a* (or terminal 121*b*) as shown in FIG. 1.

The semiconductor device structure 200 may include a plurality of metallization layers 224. Each of the metallization layers 224 may electrically connect two or more program units 202. Each of the metallization layers 224 may electrically connect two or more fuse structures 220. Each of the metallization layers 224 may be configured to impose, transmit, or supply a voltage on a fuse electrode, such as the terminal 111 of the fuse 110 as shown in FIG. 1. In some embodiments, each of the metallization layers 224 may have a plurality of protrusions. In some embodiments, each of the metallization layers 224 may have a portion 2242*a*, a portion 2242*b*, and a portion 2242*c*. The protrusions of the metallization layers 224 may be defined by portions 2242*a*, 2242*b*, and 2242*c*.

In some embodiments, the portion 2242*a* (or a horizontally extending portion) may extend along the X direction. In some embodiments, the portion 2242*a* may substantially vertically overlap the active region (e.g., the region including fuse structure and the transistor) of the programming units 202. In some embodiments, the portion 2242*a* may extend between the word lines 232*a* and 232*b*.

In some embodiments, the portion 2242*b* (or a longitudinally extending portion) may extend along the Y direction. In some embodiments, the portion 2242*b* may be substantially orthogonal to the portions 2242*a* and/or 2242*c*. In some embodiments, the portion 2242*b* may substantially vertically overlap the word lines 232*a*, 232*b*, 232*c*, and 232*d*. In some embodiments, the word line 232*a* may be parallel to the portion 2242*b* of the metallization layer 224. In some embodiments, the word line 232*b* may be parallel to the portion 2242*b* of the metallization layer 224.

In some embodiments, the portion 2242*c* (or a horizontally extending portion) may extend along the X direction. In some embodiments, the portion 2242*a* may be parallel to the portion 2242*c*. In some embodiments, the portion 2242*c* may be vertically free from overlapping the active region of the programming units 202. In some embodiments, the portion 2242*c* may be misaligned with the portion 2242*a*.

The semiconductor device structure 200 may include a doped region 240. The doped region 240 may be configured to define source/drain features of the transistors 230*a* and 230*b*. The doped region 240 may be configured to define channels between the transistor 230*a* (or 230*b*) and the fuse structure 220.

The semiconductor device structure 200 may include a conductive contact 262*a*, a conductive contact 262*b*, and a conductive contact 266. The conductive contact 262*a* may be disposed over the doped region 240 and electrically connected to the transistor 230*a*. The conductive contact 262*b* may be disposed over the doped region 240 and electrically connected to the transistor 230*b*. The conductive contact 266 may be disposed over the metallization layer 224 and electrically connected to the fuse structure 220.

As shown in FIG. 2B, the substrate 210 may be a semiconductor substrate, such as a bulk semiconductor, a semiconductor-on-insulator (SOI) substrate, or the like. The substrate 210 can include an elementary semiconductor including silicon or germanium in a single crystal form, a polycrystalline form, or an amorphous form; a compound semiconductor material including at least one of silicon carbide, gallium arsenide, gallium phosphide, indium phosphide, indium arsenide, and indium antimonide; an alloy semiconductor material including at least one of SiGe, GaAsP, AlInAs, AlGaAs, GaInAs, GaInP, and GaInAsP; any other suitable materials; or a combination thereof. In some embodiments, the alloy semiconductor substrate may be a SiGe alloy with a gradient Ge feature in which the Si and Ge composition changes from one ratio at one location to another ratio at another location of the gradient SiGe feature. In another embodiment, the SiGe alloy is formed over a silicon substrate. In some embodiments, a SiGe alloy can be mechanically strained by another material in contact with the SiGe alloy. In some embodiments, the substrate 210 may have a multilayer structure, or the substrate 210 may include a multilayer compound semiconductor structure. The substrate 210 may have a surface 210*s*1. The surface 210*s*1 may also be referred to as an upper surface.

In some embodiments, the substrate 210 may include a well region (not annotated). In some embodiments, the well region may include a first conductive type. In some embodiments, the first conductive type is a p-type. In some embodiments, p-type dopants include boron (B), other group III elements, or any combination thereof. In some embodiments, the first conductive type is an n-type. In some embodiments, n-type dopants include arsenic (As), phosphorus (P), other group V elements, or any combination thereof.

The isolation structure 212 may be embedded in the substrate 210. The isolation structure 212 may include a shallow trench isolation (STI), a local oxidization of silicon (LOCOS) structure, or any other suitable isolation structure. The isolation structure 212 may include a dielectric material, such as silicon oxide, silicon nitride, silicon oxynitride, or a combination thereof.

The substrate 210 may define the opening 214 extending from the surface 210*s*1 toward a direction far away from the surface 210*s*1. In some embodiments, the opening 214 may be disposed between the word lines 232*a* and 232*b*. The substrate 210 may have a surface 210*s*2 (or a lateral surface) defining the sidewall of the opening 214. In some embodiments, the opening 214 may have an oval-shaped profile. In some embodiments, the surface 210*s*2 of the substrate 210 may be protruded toward the word lines 232*a* and/or 232*b*.

The semiconductor device structure 200 may include an isolation layer 222. The isolation layer 222 may include a dielectric material, such as silicon oxide, silicon nitride, silicon oxynitride, or a combination thereof. In some embodiments, the isolation layer 222 may include a single layer structure or a multilayered structure that include an interfacial layer and a high-k (dielectric constant greater than 7) dielectric layer. The high-k dielectric layer may include, but is not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric layer may further include dopants such as, for example, lanthanum and aluminum. In some embodiments, the isolation layer 222 may include a fuse medium 2221 and an upper layer 2222.

In some embodiments, the fuse medium 2221 may be disposed within the opening 214. In some embodiments, the fuse medium 2221 is adapted to change from a first conductive state to a second conductive state after a current exceeding a threshold level flows through the fuse medium 2221. For example, the resistance of the fuse medium 2221 may be changed after a current exceeding a threshold level flows through the fuse medium 2221. Thus, the resistance of the fuse structure 220 may be changed after a current exceeding a threshold level flows through the fuse structure 220. In some embodiments, the fuse medium 2221 has a breakdown after a current exceeding the threshold level flows through the fuse medium 2221.

The fuse medium 2221 may be embedded in the substrate 210. In some embodiments, the fuse medium 2221 may include a surface 222_s_1 and a surface 222_s_2. In some embodiments, the surface 222_s_1 (or a lower surface) may be a substantially flat surface. In some embodiments, the surface 222_s_1 of the fuse medium 2221 may be substantially parallel to the surface 210_s_1 of the substrate 210. The surface 222_s_2 (or a lateral surface) may extend between the surface 210_s_1 of the substrate 210 and the surface 222_s_1 of the fuse medium 2221. In some embodiments, the surface 222_s_2 may include a curved surface. In some embodiments, the surface 222_s_2 may be protruded toward the word lines 232_a_ and/or 232_b_.

The upper layer 2222 may be connected to the fuse medium 2221. The upper layer 2222 may be disposed over the surface 210_s_1 of the substrate 210. In some embodiments, the fuse medium 2221 and the upper layer 2222 may be a monolithic structure.

The semiconductor device structure 200 may include a metallization layer 224. The metallization layer 224 may include a conductive material, such as tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the metallization layer 224 may include a fuse electrode 2241 and a top plate portion 2242.

In some embodiments, the fuse electrode 2241 may be disposed within the opening 214. In some embodiments, the fuse electrode 2241 may function as the terminal 111 of the fuse 110 as shown in FIG. 1. In some embodiments, the fuse electrode 2241 may be disposed on the fuse medium 2221 of the isolation layer 222. The fuse electrode 2241 may be embedded in the substrate 210. In some embodiments, the fuse electrode 2241 may include a surface 224_s_1 and a surface 224_s_2. In some embodiments, the surface 224_s_1 (or a lower surface) may be a substantially flat surface. In some embodiments, the surface 224_s_1 of the fuse electrode 2241 may be substantially parallel to the surface 210_s_1 of the substrate 210. The surface 224_s_2 (or a lateral surface) may extend between the surface 210_s_1 of the substrate 210 and the surface 224_s_1 of the fuse electrode 2241. In some embodiments, the surface 224_s_2 may include a curved surface. In some embodiments, the surface 224_s_2 may be protruded toward the word lines 232_a_ and/or 232_b_. In some embodiments, the surface 224_s_2 of the fuse electrode 224 may vertically overlap the surface 222_s_2 of the fuse medium 222. In some embodiments, the fuse electrode 2241 may be replaced by a semiconductor material, such as polysilicon, silicon-germanium, and/or other suitable materials.

The top plate portion 2242 may be connected to the fuse electrode 2241. The top plate portion 2242 may be disposed over the surface 210_s_1 of the substrate 210. The top plate portion 2242 may be disposed over the upper layer 2222 of the isolation layer 222. In some embodiments, the fuse electrode 2241 and the top plate portion 2242 may be a monolithic structure. In some embodiments, the top plate portion 2242 may include the portions 2242_a_, 2242_b_, and 2242_c_ as shown in FIG. 2A. In some embodiments, the top plate portion 2242 of the metallization layer 224 may vertically overlap the word line 232_a_. In some embodiments, the top plate portion 2242 of the metallization layer 224 may vertically overlap the word line 232_b_. In some embodiments, the top plate portion 2242 of the metallization layer 224 may extend between the word lines 232_a_ and 232_b_.

In some embodiments, the top plate portion 2242 of the metallization layer 224 may define an air gap 216. In some embodiments, the air gap 216 may be disposed between the transistors 230_a_ and 230_b_. In some embodiments, the air gap 216 may be disposed between the word lines 232_a_ and 232_b_. In some embodiments, the air gap 216 may be surrounded by the fuse electrode 2241 of the metallization layer 224. In some embodiments, the air gap 216 may have an oval-shaped profile. The air gap 216 may have a dielectric constant about 1, which thereby improves leakage of the programing unit 202.

In some embodiments, the word line 232_a_ may be disposed at a side 220_s_1 of the fuse structure 220. In some embodiments, the word line 232_a_ may be embedded within the substrate 210. In some embodiments, the word line 232_a_ may be recessed from the surface 210_s_1 of the substrate 210. The word line 232_a_ may include conductive materials, such as tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. In some embodiments, the word line 232_a_ may include a semiconductor material, such as polysilicon or other suitable semiconductor materials.

In some embodiments, the word line 232_b_ may be disposed at a side 220_s_2, opposite to the side 220_s_1, of the fuse structure 220. In some embodiments, the word line 232_b_ may be embedded within the substrate 210. In some embodiments, the word line 232_a_ may be recessed from the surface 210_s_1 of the substrate 210. In some embodiments, the word line 232_b_ may be spaced apart from the word line 232_a_ by the fuse structure 220. In some embodiments, the material of the word line 232_b_ may the same as or similar to that of the word line 232_a_.

In some embodiments, the doped region 240 may be disposed within the substrate 210. The doped region 240 may be adjacent to the surface 210_s_2 of the substrate 210. In some embodiments, the doped region 240 may have a second conductive type different from the first conductive type. The doped region 240 may surround the word line 232_a_. The doped region 240 may surround the word line 232_b_. The doped region 240 may surround the fuse electrode 2241 of the metallization layer 224. The dopant concentration of the doped region 240 may be on the order of $10^{20}$ dopant ions/$cm^3$. In some embodiments, the doped region 240 may include doped regions 242_a_, 242_b_, 244_a_, and 244_b_.

The doped region 242_a_ may be disposed between the isolation structure 212 and the word line 232_a_. In some embodiments, the doped region 242*a* may function as a source/drain feature of the transistor 230*a*.

The doped region 242*b* may be disposed between the isolation structure 212 and the word line 232*b*. In some embodiments, the doped region 242*b* may function as a source/drain feature of the transistor 230*b*.

The doped region 244*a* may be disposed between the word line 232*a* and the fuse structure 220. The doped region 244*a* may be disposed between the word line 232*a* and the fuse electrode 2241 of the metallization layer 224. In some embodiments, the doped region 244*a* may function as a source/drain feature of the transistor 230*a*. The doped region 244*a* may function as a channel to transmit carriers or accumulate carriers, which thereby facilitate blowing the fuse structure 220.

The doped region 244*b* may be disposed between the word line 232*b* and the fuse structure 220. The doped region 244*b* may be disposed between the word line 232*b* and the fuse electrode 2241 of the metallization layer 224. In some embodiments, the doped region 244*b* may function as a source/drain feature of the transistor 230*b*. The doped region 244*b* may function as a channel to transmit carriers or accumulate carriers, which thereby facilitate blowing the fuse structure 220.

In some embodiments, a distance D1 between the word line 232*a* and the fuse electrode 2241 of the metallization layer 224 may vary along a direction far away from the surface 210*s*1 of the substrate 210. For example, the word line 232*a* and the fuse electrode 2241 of the metallization layer 224 may have a smaller distance at the middle, which is between the sidewall of the word line 232*a* and the surface 224*s*1, of the surface 224*s*2; the word line 232*a* and the fuse electrode 2241 of the metallization layer 224 may have a greater distance adjacent to the surface 210*s*1 of the substrate 210. In some embodiments, a depth D2 (or a length) of the doped region 240 may be configured to control the location of isolation layer 222 to be blown.

The semiconductor device structure 200 may include a block layer 250 (or an etching stop layer). In some embodiments, the block layer 250 may be embedded in the substrate 210. In some embodiments, the block layer 250 may be disposed under the fuse structure 220. In some embodiments, the block layer 250 may be disposed under the fuse medium 2221. In some embodiments, the block layer 250 may be disposed under the fuse electrode 2241. In some embodiments, the block layer 250 may be in contact with the isolation layer 222. In some embodiments, the material of the block layer 250 may be different from that of the isolation layer 222. The block layer 250 may include a dielectric material, such as silicon nitride, silicon oxide, silicon oxynitride, or a combination thereof. In some embodiments, the block layer 250 may have a surface 250*s*1 (or an upper surface). The surface 250*s*1 of the block layer 250 may be a substantially flat surface. In some embodiments, the surface 250*s*1 of the block layer 250 may be substantially parallel to the surface 210*s*1 of the substrate 210.

The semiconductor device structure 200 may include a dielectric structure 260. The dielectric structure 260 may be disposed over the surface 210*s*1 of the substrate 210. In some embodiments, the dielectric structure 260 may cover the metallization layer 224. The dielectric structure 260 may include silicon nitride, silicon oxide, silicon oxynitride, flowable oxide, tonen silazen, undoped silica glass, borosilica glass, phosphosilica glass, borophosphosilica glass, plasma-enhanced tetraethyl orthosilicate, fluoride silicate glass, carbon-doped silicon oxide, or a combination thereof.

The conductive contact 262*a* may be disposed over the doped region 242*a*. The conductive contact 262*a* may be electrically connected to the transistor 230*a*. The conductive contact 262*a* may penetrate the dielectric structure 260. The conductive contact 262*a* may include tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

The conductive contact 262*b* may be disposed over the doped region 242*b*. The conductive contact 262*b* may be electrically connected to the transistor 230*b*. The conductive contact 262*b* may penetrate the dielectric structure 260. The conductive contact 262*b* may include tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

The conductive contact 266 may be disposed over the metallization layer 224. The conductive contact 266 may be electrically connected to the fuse structure 220. The conductive contact 266 may penetrate the dielectric structure 260. The conductive contact 266 may include tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof.

The semiconductor device structure 200 may include a conductive layer 264*a*, a conductive layer 264*b*, and a conductive layer 268. The conductive layer 264*a* may be disposed over the dielectric structure 260. The conductive layer 264*a* may be electrically connected to the conductive contact 262*a*.

The conductive layer 264*b* may be disposed over the dielectric structure 260. The conductive layer 264*b* may be electrically connected to the conductive contact 262*b*. Although not shown, the conductive layer 264*a* may be electrically connected to the conductive layer 264*b* by traces at higher metallization layer (or by traces at the level the same as that of the conductive layer 264*a*) so that the word lines 232*a* and 232*b* may have the same potential.

The conductive layer 268 may be disposed over the conductive contact 266. The conductive layer 268 may be electrically connected to the conductive contact 266.

In this embodiment, the word lines 232*a* and 232*b* are electrically coupled with the fuse structure 220. Further, the word lines 232*a* and 232*b* are electrically coupled in parallel. As a result, a relatively large driving current can be generated. The metallization layer 224 has the surface 224*s*2 protruded toward the word lines 232*a* and 232*b*. Therefore, the distance between the fuse structure 220 and the transistor 230*a* (or transistor 230*b*) can be reduced. Accordingly, the performance of the semiconductor device structure 200 can be enhanced.

Figure 3:
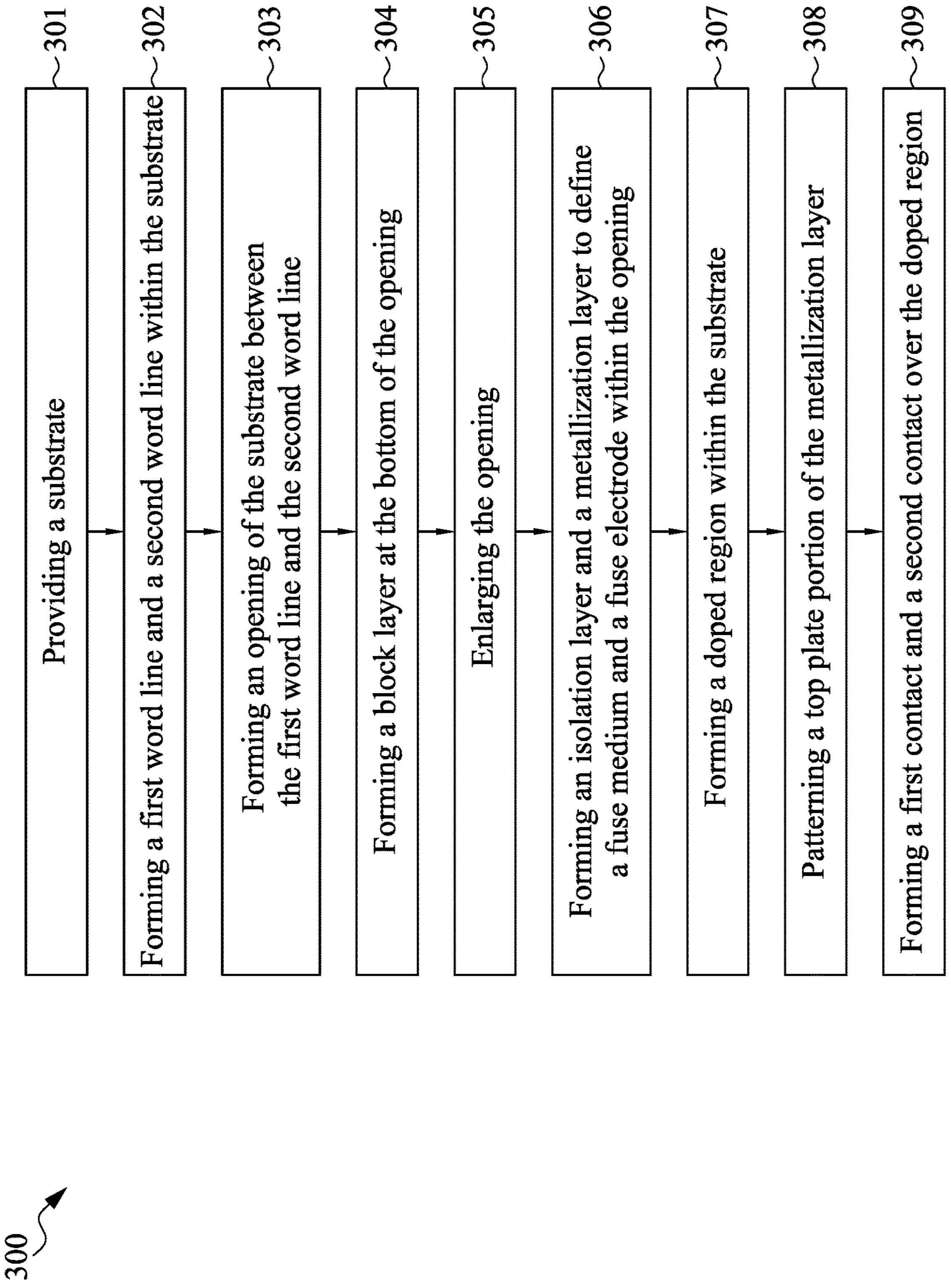
FIG. 3 is a flowchart illustrating a method of manufacturing a semiconductor device structure, in accordance with some embodiments of the present disclosure.

FIG. 3 is a flowchart illustrating a method 300 of manufacturing a semiconductor device structure, in accordance with some embodiments of the present disclosure. More specifically, the method 300 may be configured to produce a programing unit including a fuse structure and two transistors configure to switch the fuse structure.

The method 300 begins with operation 301 in which a substrate may be provided.

The method 300 continues with operation 302 in which a first word line and a second word line may be formed within the substrate.

The method 300 continues with operation 303 in which an opening may be formed within the substrate and between the first word line and the second word line.

The method 300 continues with operation 304 in which a block layer may be formed at the bottom of the opening.

The method 300 continues with operation 305 in which the opening may be enlarged by performing a treatment (e.g., a hydrogen annealing technique). As a result, the opening may have an extending portion protruded toward the first word line and the second word line. That is, the sidewall defining the opening may have a curved surface protruded toward the first word line and the second word line.

The method 300 continues with operation 306 in which an isolation layer and a metallization layer may be formed. As a result, a fuse medium and a fuse electrode may be formed within the opening of the substrate. An air gap may be formed and surrounded by the fuse electrode.

The method 300 continues with operation 307 in which a doped region may be formed within the substrate. As a result, a source/drain feature of the transistor may be defined. Further, a channel between the transistor and the fuse structure may be defined. In this embodiment, a blanket implantation technique may be performed to form the doped region.

The method 300 continues with operation 308 in which a top plate portion of the metallization layer may be patterned. As a result, the top plate portion of the metallization layer may have a first portion, a second portion, and a third portion. The first portion may extend horizontally and overlap the fuse structure as well as the transistors. The first portion may vertically overlap the first word line and the second word line. The second portion may extend longitudinally. The second portion may extend along a direction substantially parallel to an extending direction of the first word line and the second word line. The third portion may be parallel to and misaligned with the first portion.

The method 300 continues with operation 309 in which a first conductive contact and a second conductive contact may be formed over the source/drain feature of the transistors. The first conductive contact may be electrically connected to the second conductive contact.

The method 300 is merely an example, and is not intended to limit the present disclosure beyond what is explicitly recited in the claims. Additional operations can be provided before, during, or after each operation of the method 300, and some operations described can be replaced, eliminated, or reordered for additional embodiments of the method. In some embodiments, the method 300 can include further operations not depicted in FIG. 3. In some embodiments, the method 300 can include one or more operations depicted in FIG. 3.

FIG. 4A to FIG. 14A and FIG. 4B to FIG. 14B illustrate stages of an exemplary method for manufacturing a semiconductor device structure according to some embodiments of the present disclosure in different perspectives. FIG. 4A to FIG. 14A are top views. FIG. 4B to FIG. 14B are cross-sectional views along line A-A' of FIG. 4A to FIG. 14A, respectively.

Figure 4A:
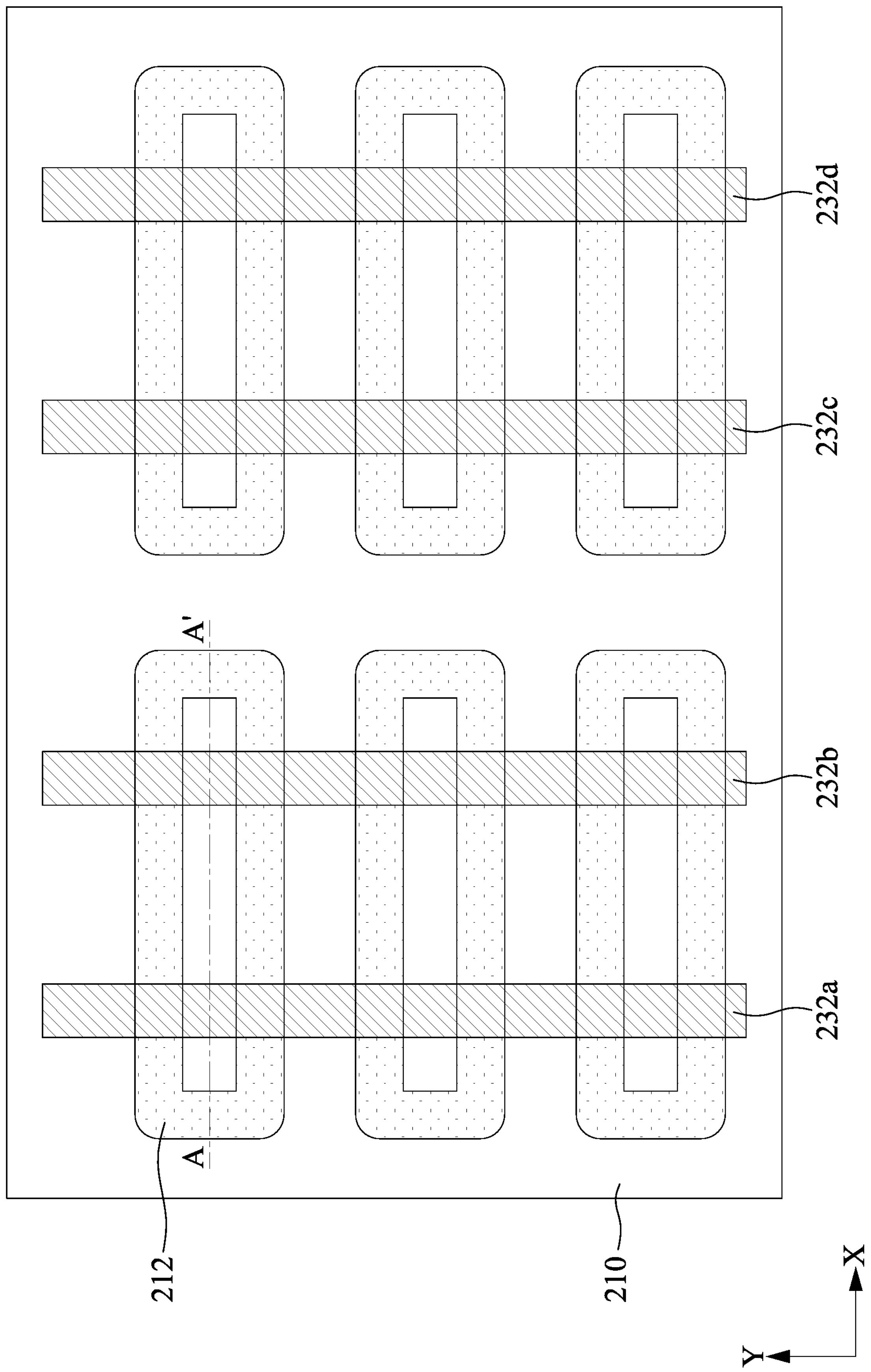
FIG. 4A and FIG. 4B illustrate one or more stages of an exemplary method for manufacturing a semiconductor device structure according to some embodiments of the present disclosure in different perspectives.
Figure 4B:
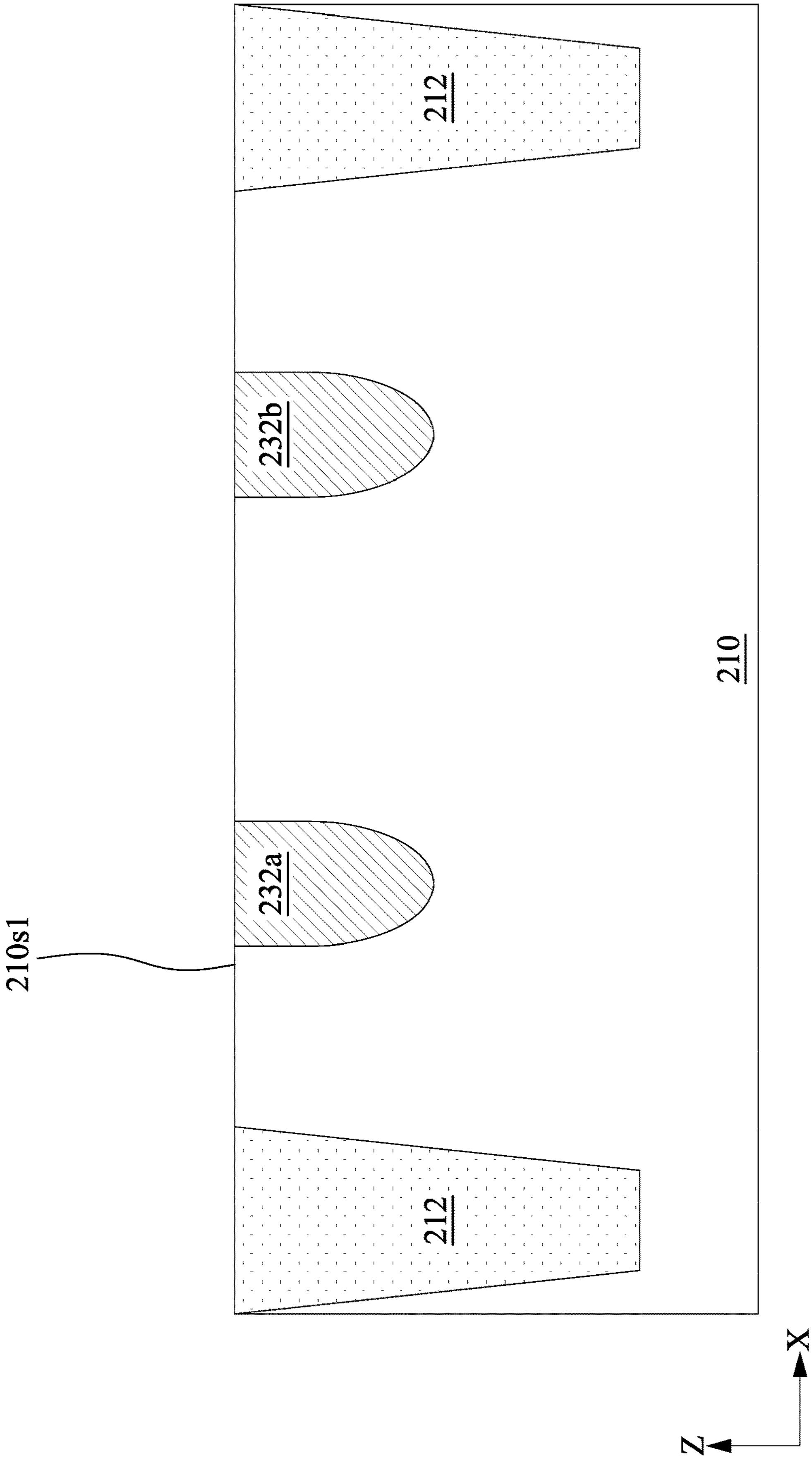

Referring to FIG. 4A and FIG. 4B, a substrate 210 may be provided. Isolation structure 212 may be formed within the substrate 210. The isolation structures 212 may be configured to define a region in which programing units, including a fuse structure and transistors are located. Word lines 232*a*, 232*b*, 232*c*, and 232*d* may be formed within the substrate 210. In some embodiments, trenches (not shown) may be formed and recessed from the surface 210*s*1 of the substrate 210, and a conductive material or a semiconductor material may fill the trenches to form the word lines 232*a*, 232*b*, 232*c*, and 232*d*.

Figure 5A:
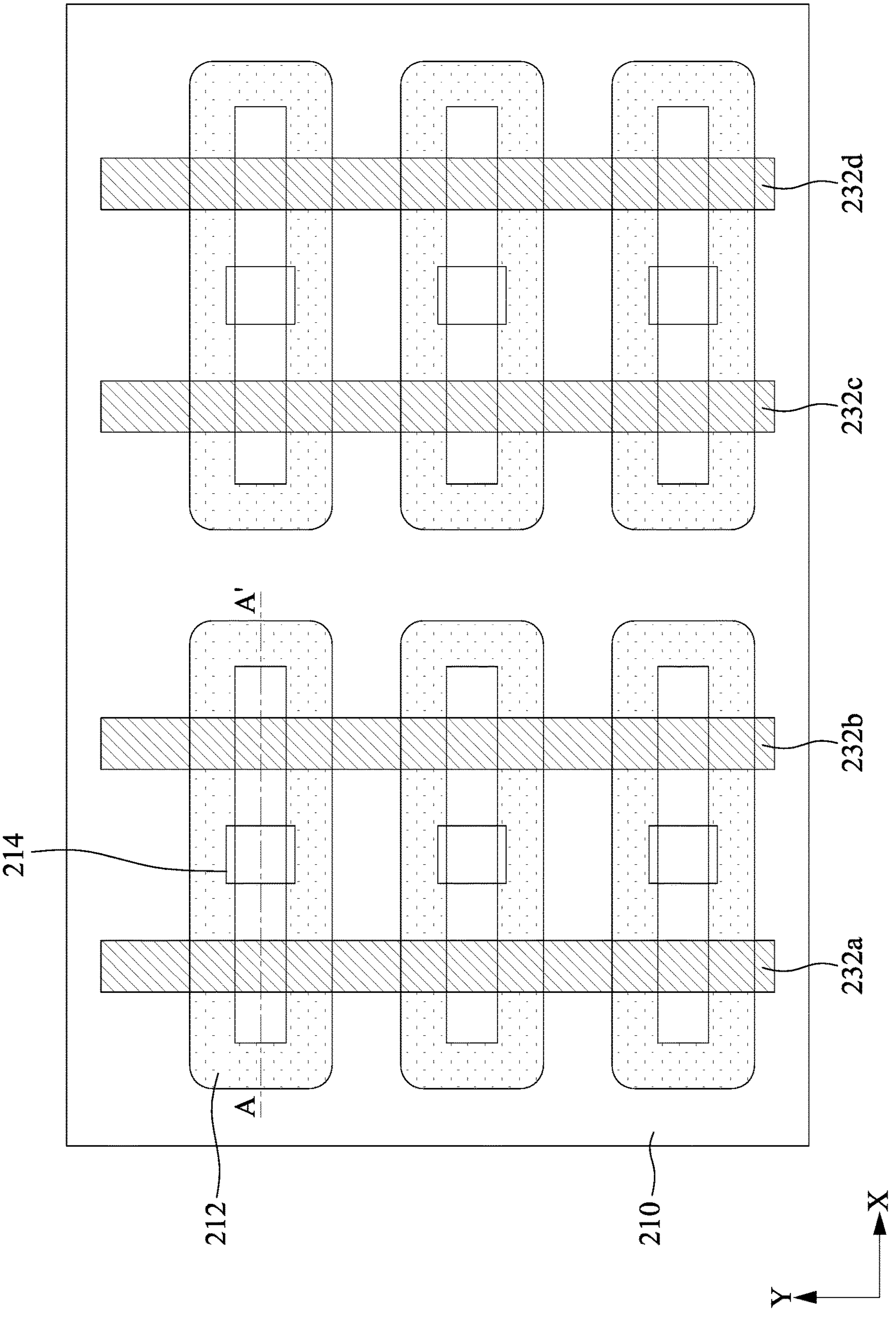
FIG. 5A and FIG. 5B illustrate one or more stages of an exemplary method for manufacturing a semiconductor device structure according to some embodiments of the present disclosure in different perspectives.
Figure 5B:
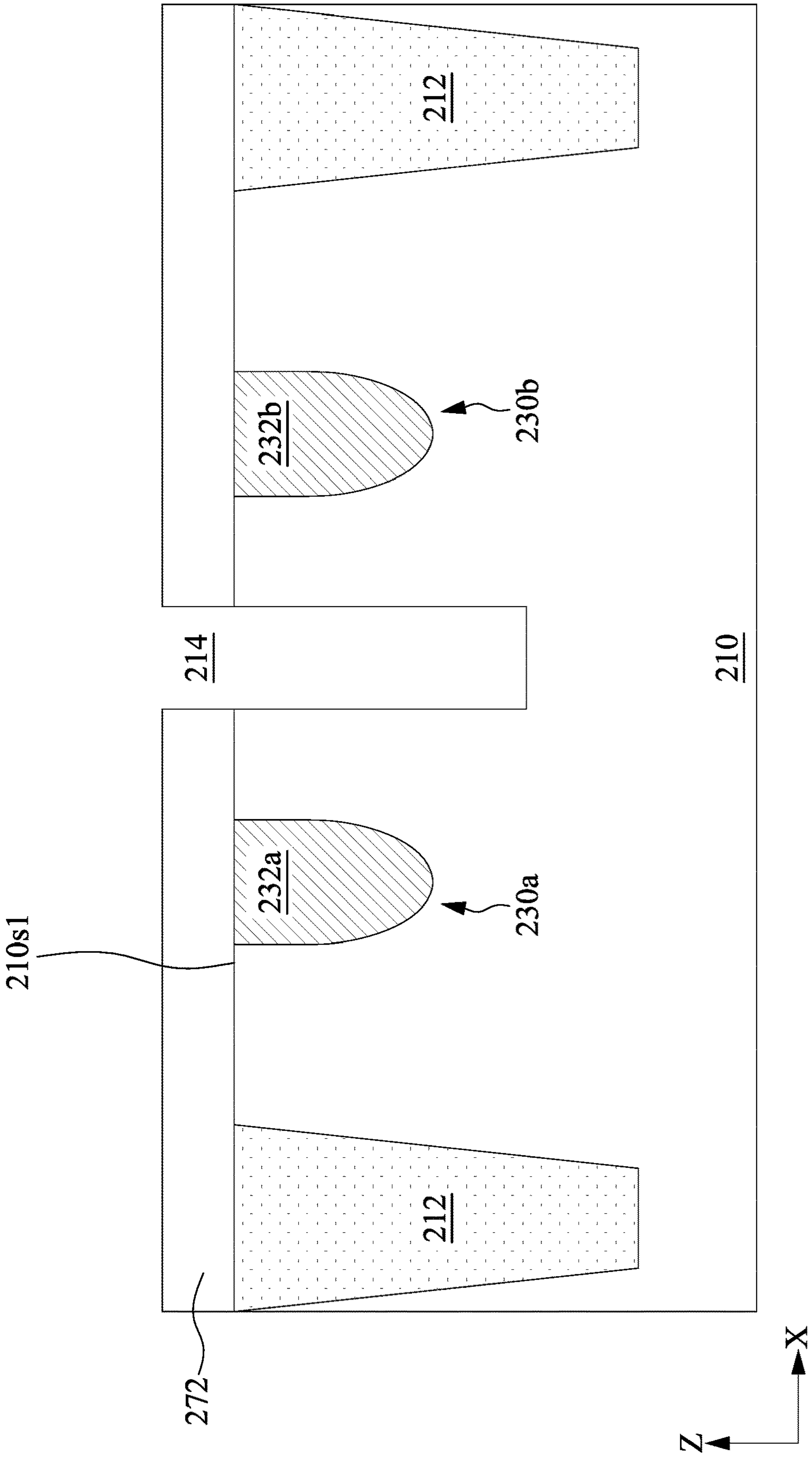

Referring to FIG. 5A and FIG. 5B, a mask 272 may be formed over the surface 210*s*1 of the substrate 210. The mask 272 may include a photosensitive material, such as a photoresist or other suitable materials. The mask 272 may be configured to define opening 214 of the substrate 210. The opening 214 may be formed by a patterning process. The patterning process may include a lithography process, an etching process and other suitable processes. The photolithography process may include photoresist coating (e.g., spin-on coating), soft baking, mask aligning, exposure, post-exposure baking, developing the photoresist, rinsing and drying (e.g., hard baking). The etching process may include, for example, a dry etching process or a wet etching process.

Figure 6A:
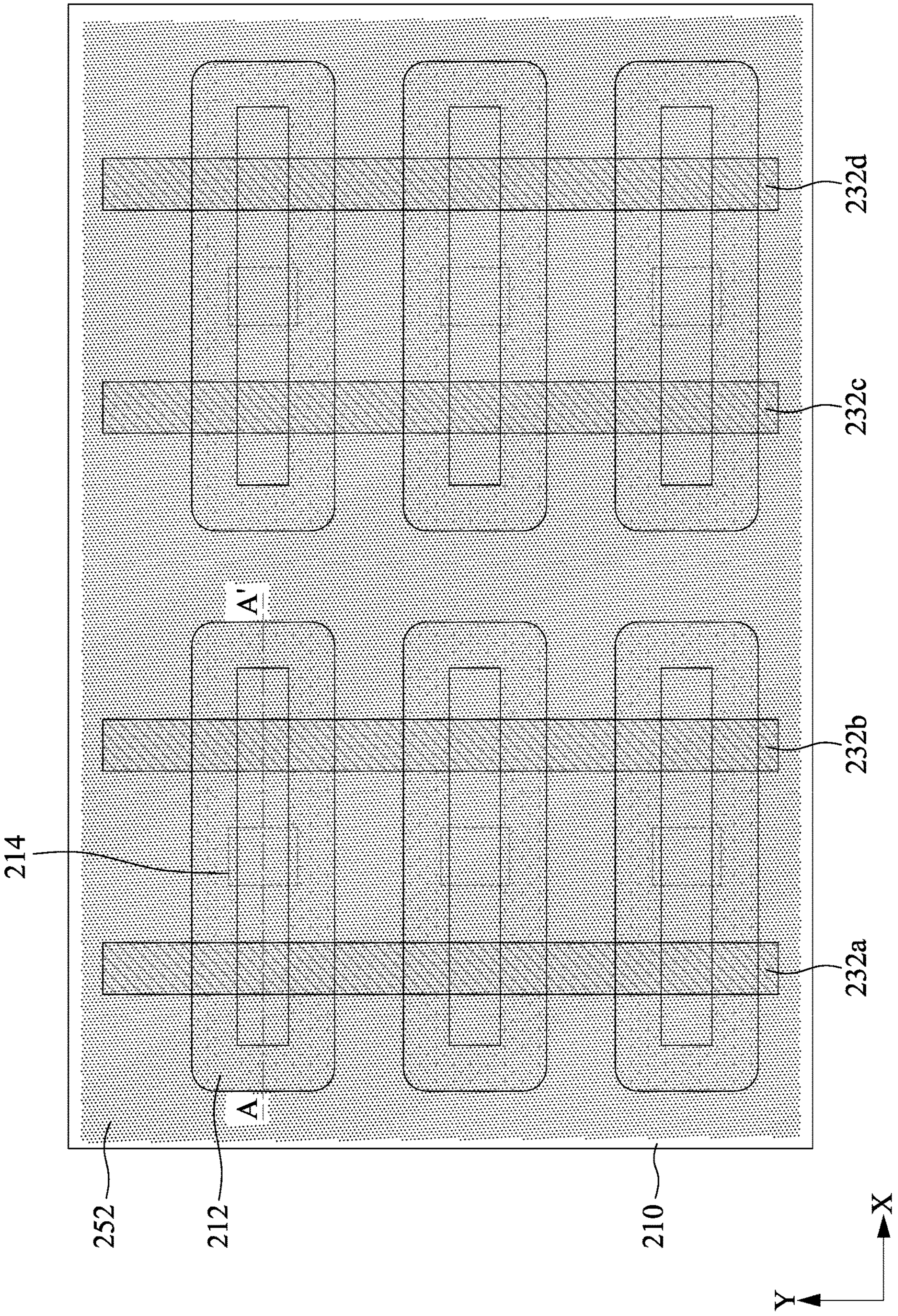
FIG. 6A and FIG. 6B illustrate one or more stages of an exemplary method for manufacturing a semiconductor device structure according to some embodiments of the present disclosure in different perspectives.
Figure 6B:
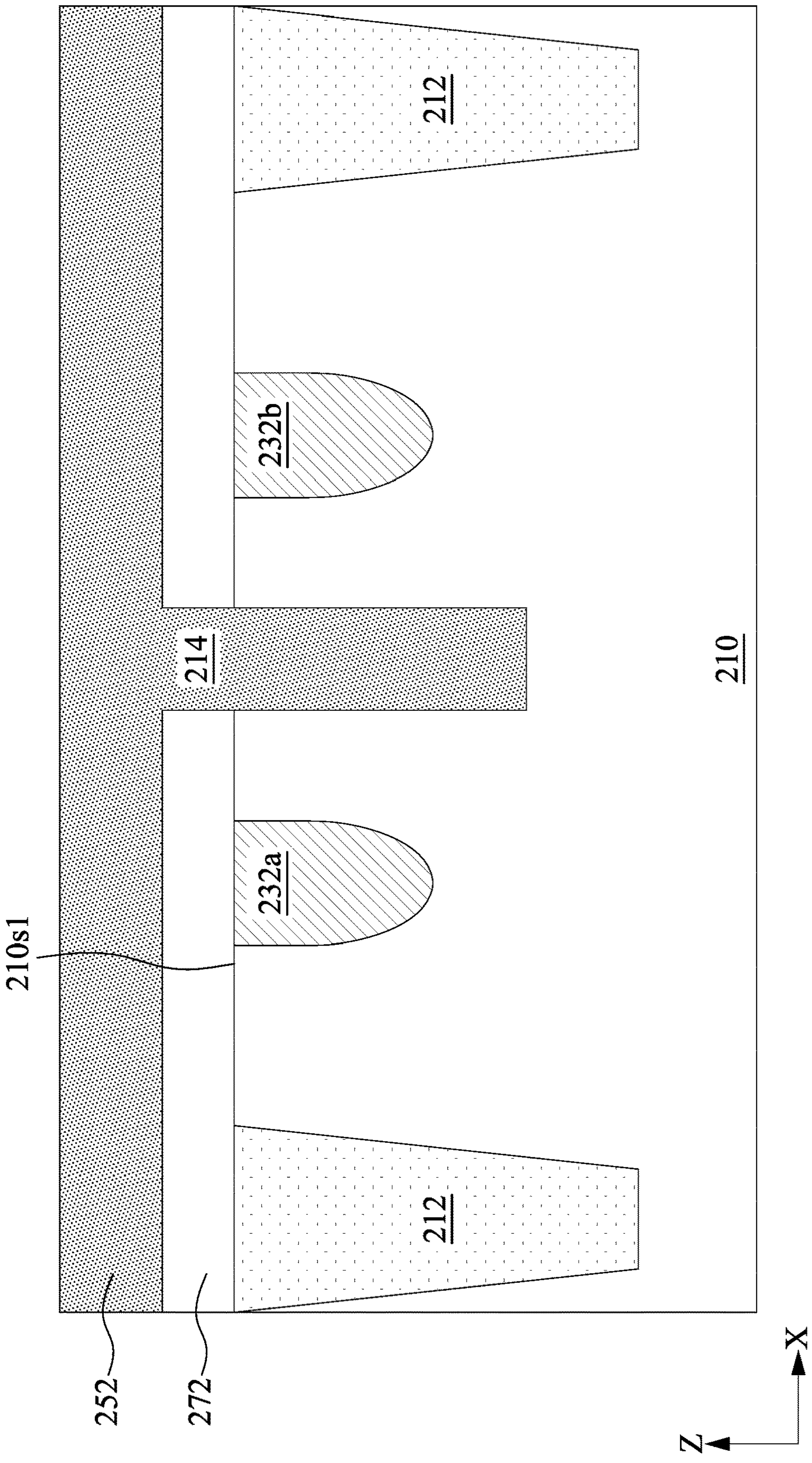

Referring to FIG. 6A and FIG. 6B, a dielectric layer 252 may be formed. The dielectric layer 252 may be formed over the mask 272. The dielectric layer 252 may be formed over the substrate 210. The dielectric layer 252 may fill the opening 214. The dielectric layer 252 may be formed by, for example, chemical vapor deposition (CVD), low-pressure chemical vapor deposition (LPCVD), plasma-enhanced CVD (PECVD), atomic layer deposition (ALD), physical vapor deposition (PVD), or other suitable processes. The dielectric layer 252 may include a dielectric material, such as silicon nitride, silicon oxide, silicon oxynitride, or a combination thereof.

Figure 7A:
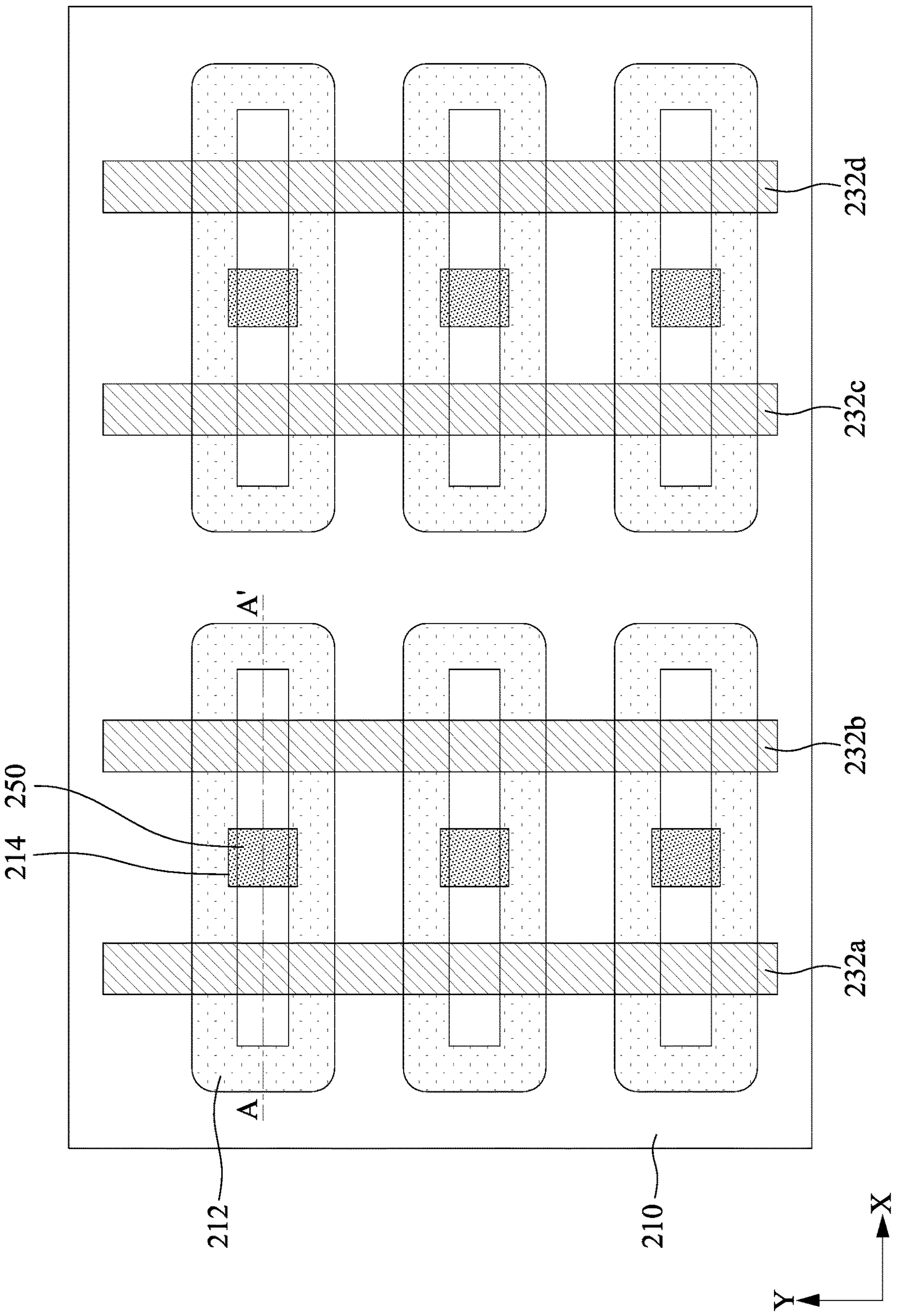
FIG. 7A and FIG. 7B illustrate one or more stages of an exemplary method for manufacturing a semiconductor device structure according to some embodiments of the present disclosure in different perspectives.
Figure 7B:
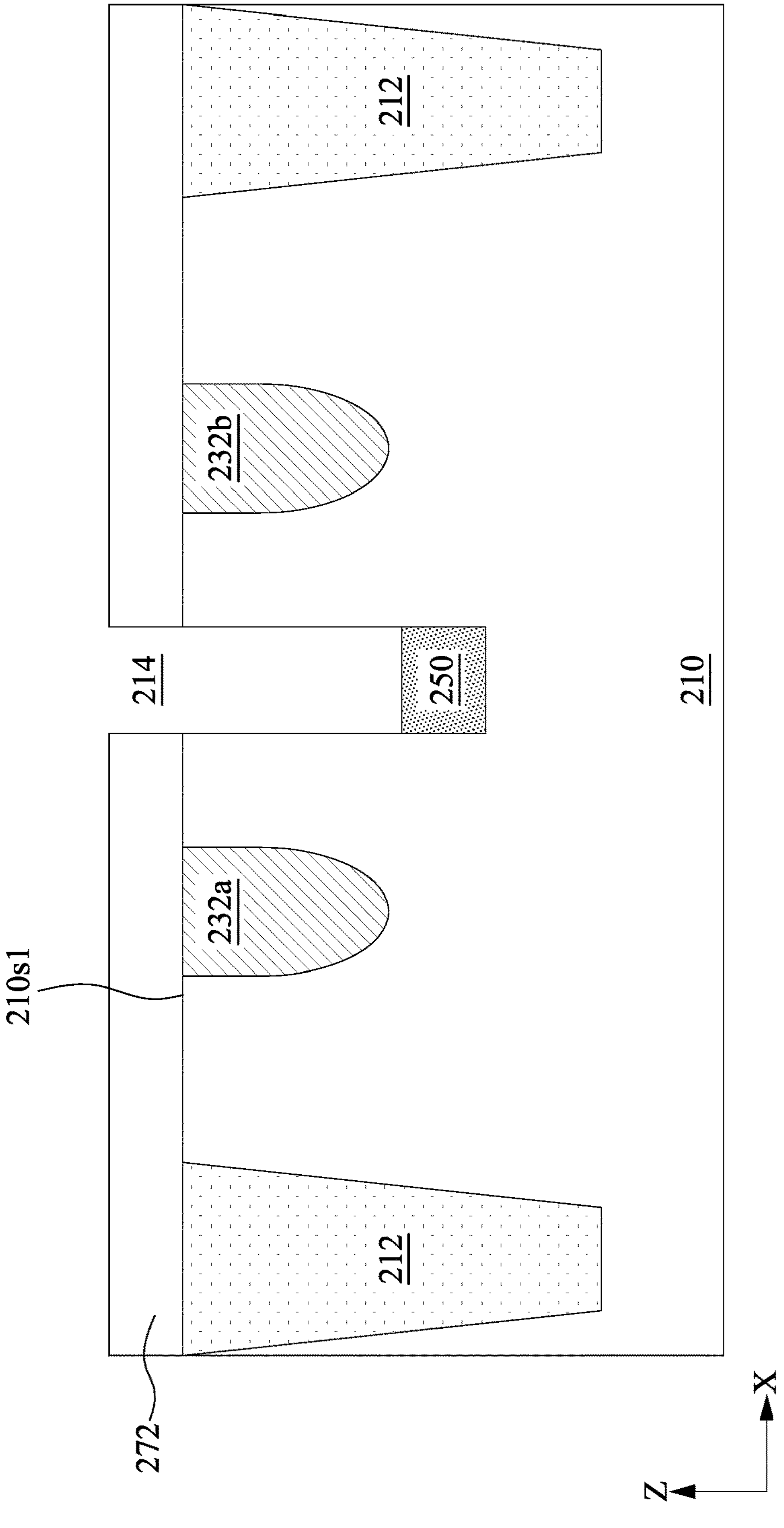

Referring to FIG. 7A and FIG. 7B, a portion of the dielectric layer 252 may be removed to define a block layer 250 on the bottom of the opening 214 of the substrate 210.

Figure 8A:
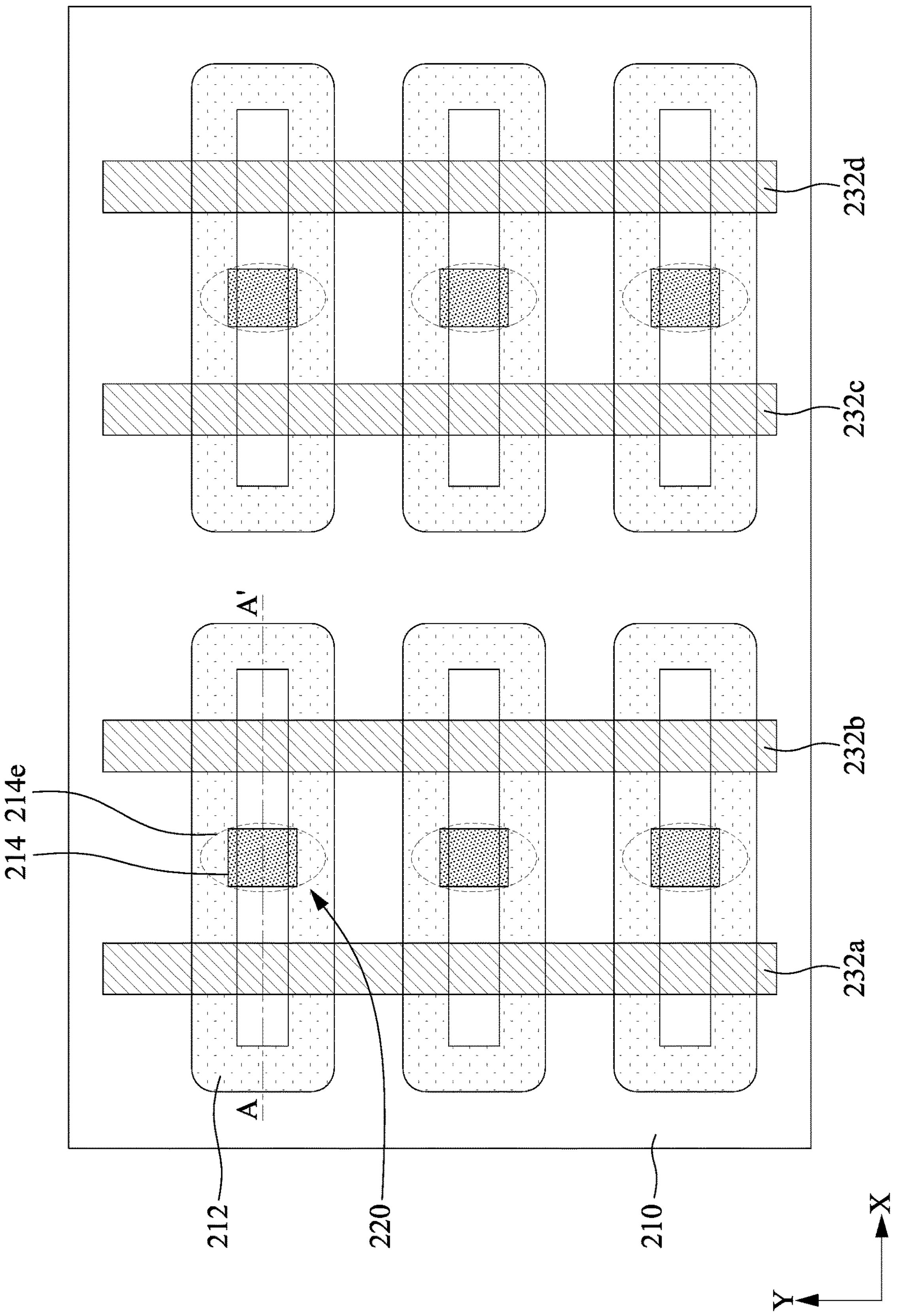
FIG. 8A and FIG. 8B illustrate one or more stages of an exemplary method for manufacturing a semiconductor device structure according to some embodiments of the present disclosure in different perspectives.
Figure 8B:
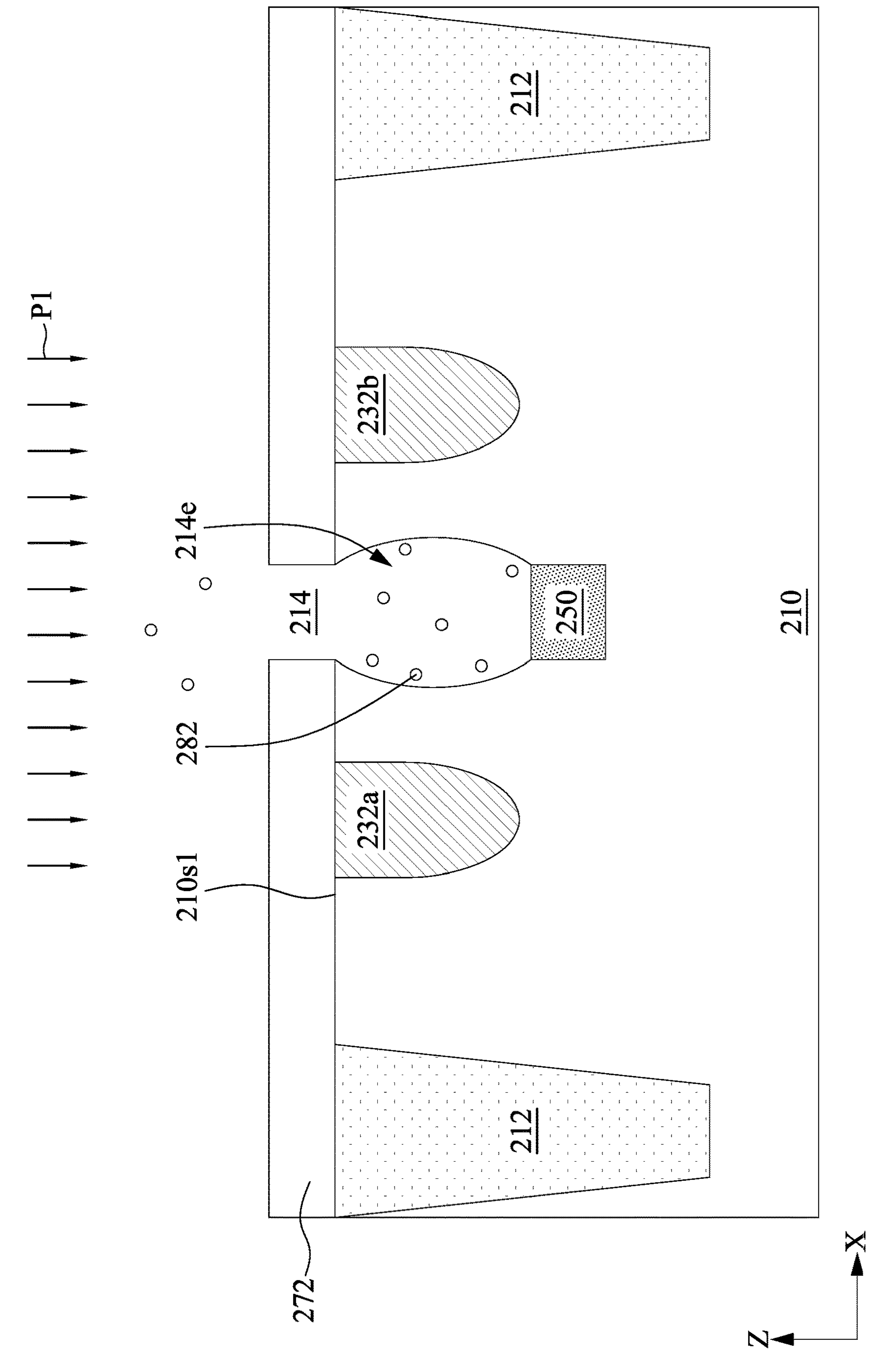

Referring to FIG. 8A and FIG. 8B, a treatment P1 may be performed. The opening 214 may be enlarged. The opening 214 may include an extending portion 214*e* under the surface 210*s*2 of the substrate 210. The extending portion 214*e* may be protruded toward the word lines 232*a* and 232*b*. In some embodiments, the treatment P1 may include an annealing technique (or an etching technique). In some embodiments, the treatment P1 may include a hydrogen ($H_2$) annealing technique. In some embodiments, the gas 282 of the anneal technique may include hydrogen or other suitable gases. The block layer 250 may be configured to prevent the depth of the opening 214 being enlarged. The block layer 250 may block the gas 282.

Figure 9A:
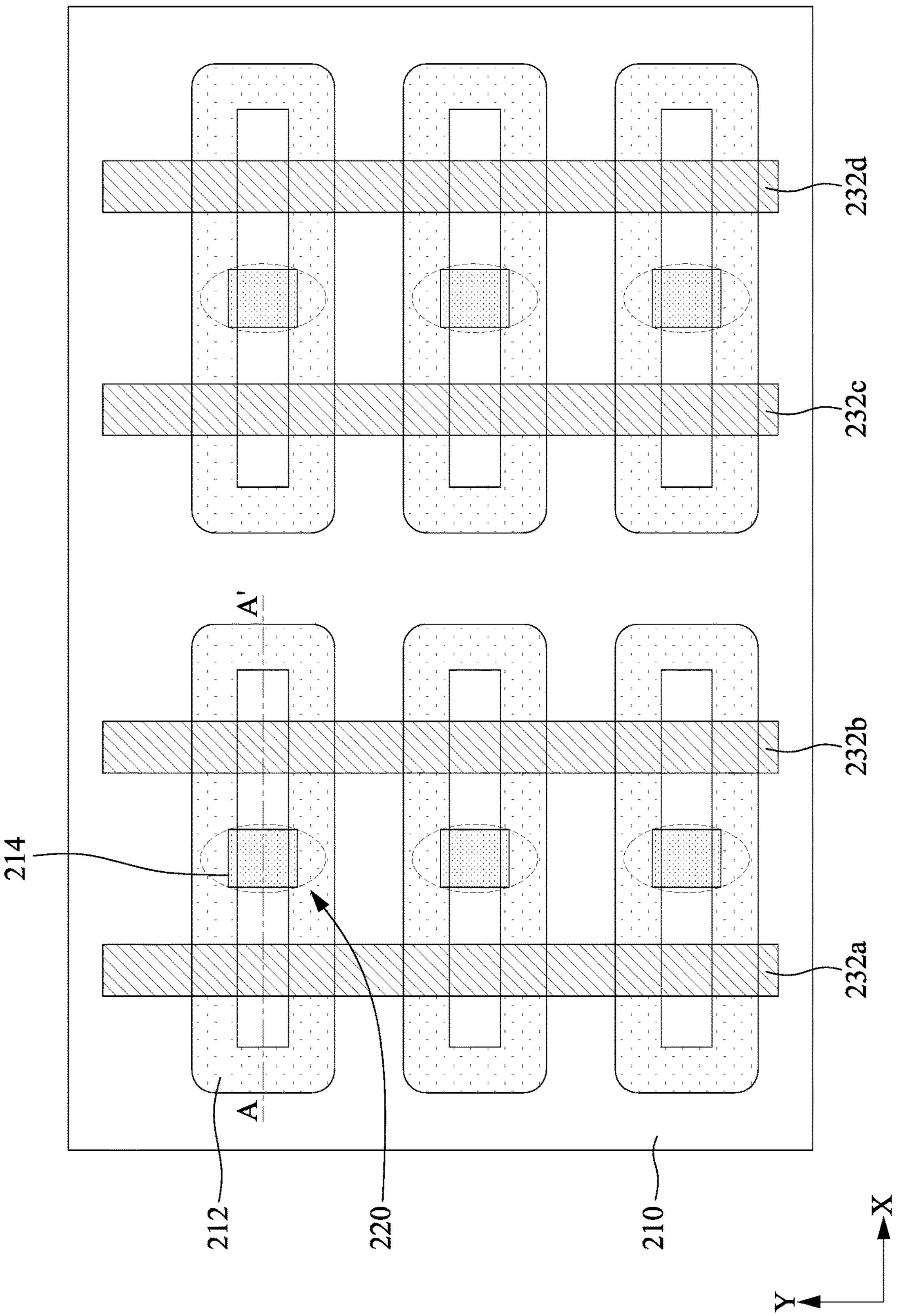
FIG. 9A and FIG. 9B illustrate one or more stages of an exemplary method for manufacturing a semiconductor device structure according to some embodiments of the present disclosure in different perspectives.
Figure 9B:
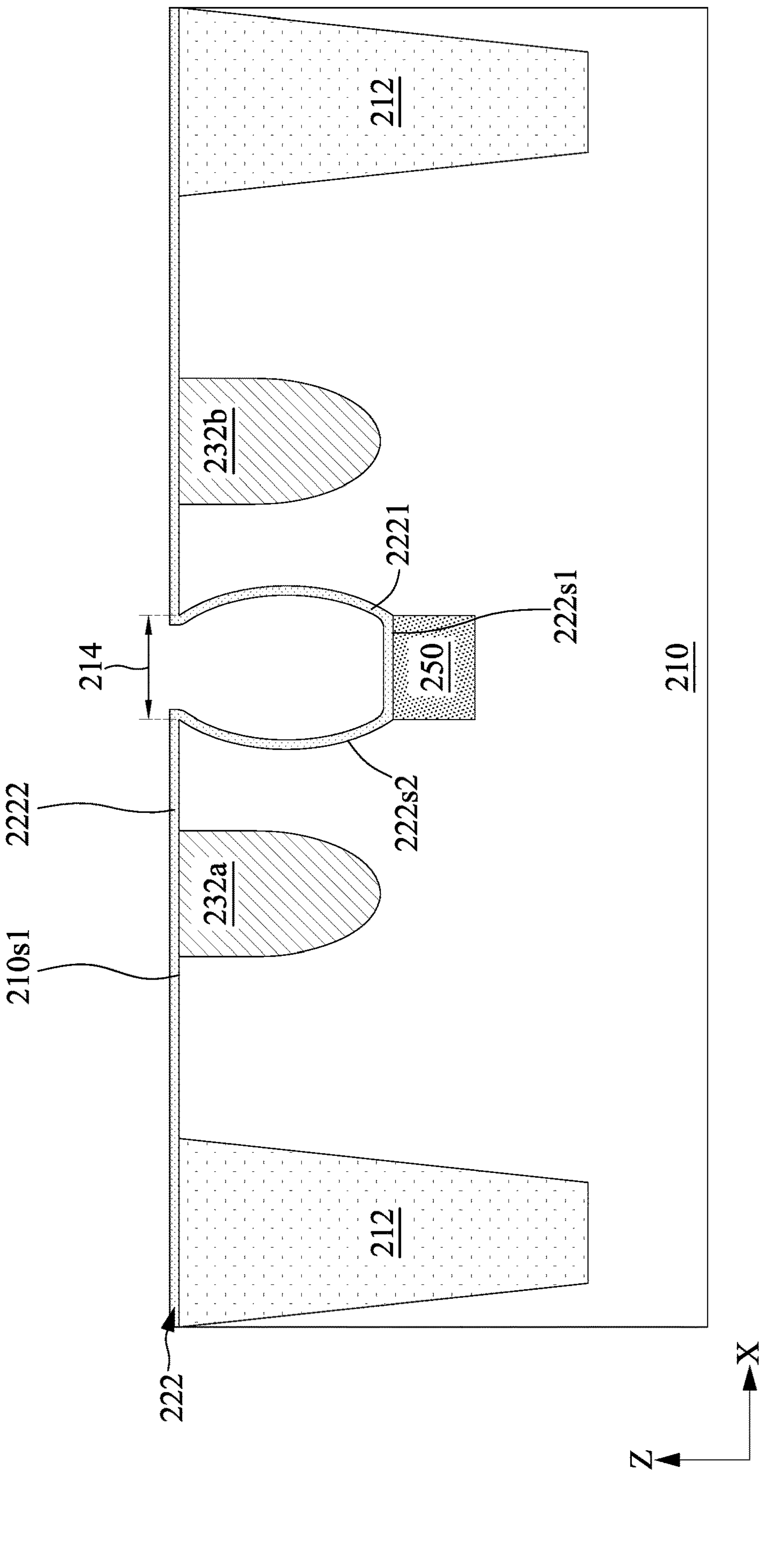

Referring to FIG. 9A and FIG. 9B, the mask 272 may be removed. An isolation layer 222 may be formed. The isolation layer 222 may include a fuse medium 2221 formed within the opening 214 and an upper layer 2222 formed over the surface 210*s*1 of the substrate 210. The fuse medium 2221 may be formed over the block layer 250. The fuse medium 2221 may have a surface 222*s*2 protruded toward the word lines 232*a* and 232*b*. The mask 272 may be formed by ALD, CVD, PVD, LPCVD, PECVD, or other suitable processes.

Figure 10A:
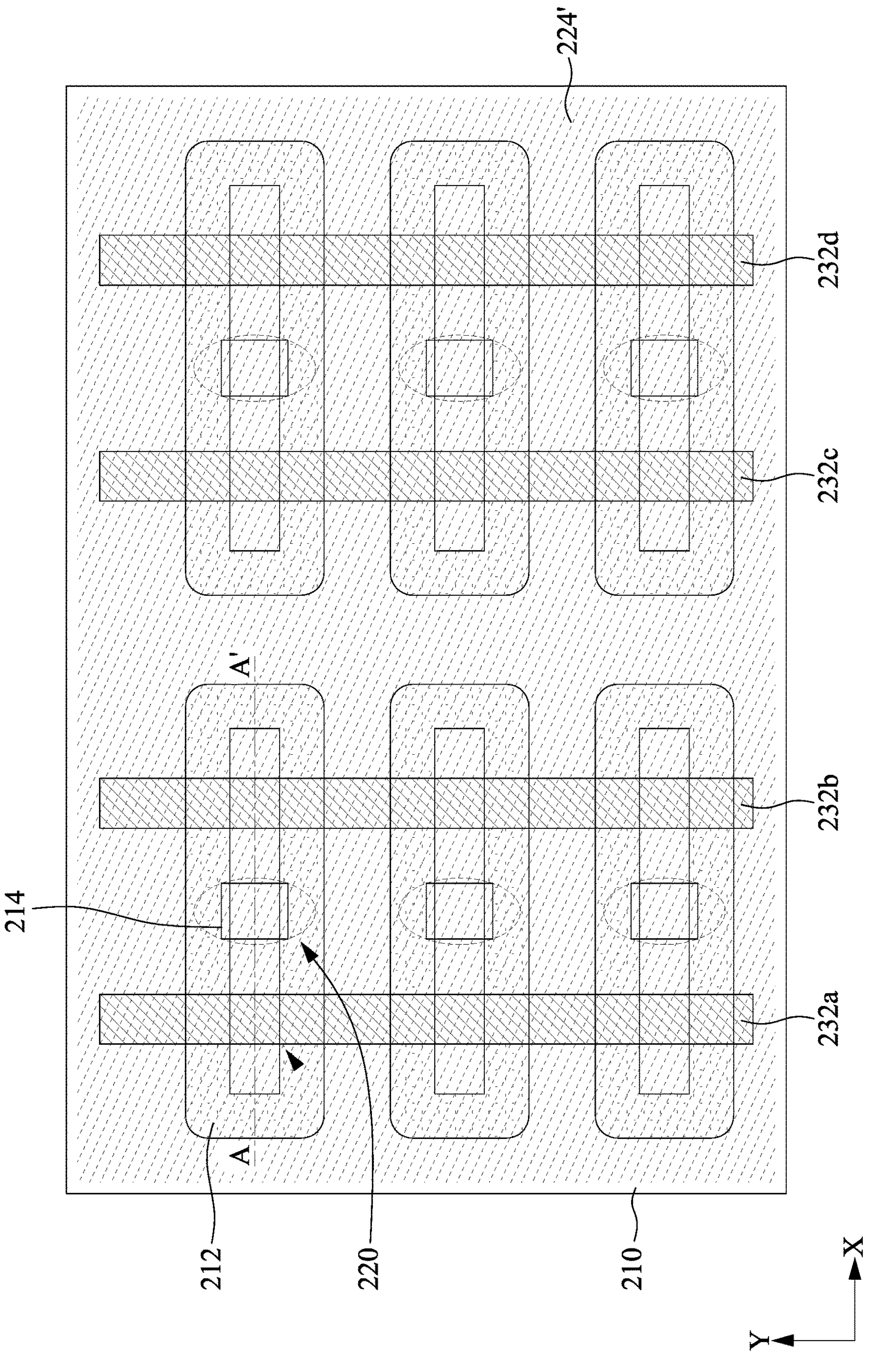
FIG. 10A and FIG. 10B illustrate one or more stages of an exemplary method for manufacturing a semiconductor device structure according to some embodiments of the present disclosure in different perspectives.
Figure 10B:
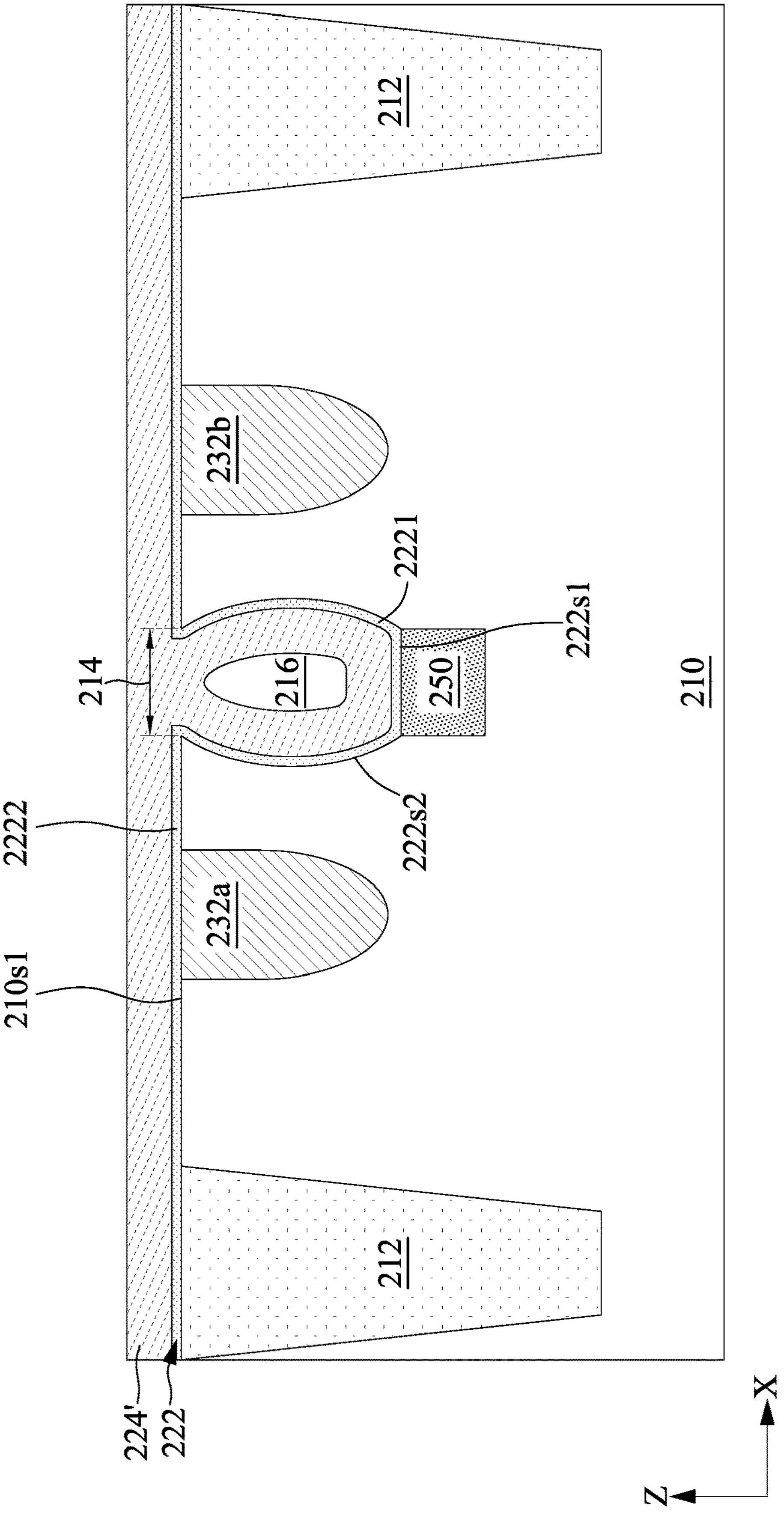

Referring to FIG. 10A and FIG. 10B, a conductive layer 224' may be formed. The conductive layer 224' may be formed over the isolation layer 222. The conductive layer 224' may be formed within the opening 214 and define an air gap 216 within the substrate 210. The conductive layer 224' may be formed by PVD, CVD, ALD, LPCVD, PECVD, or other suitable processes.

Figure 11A:
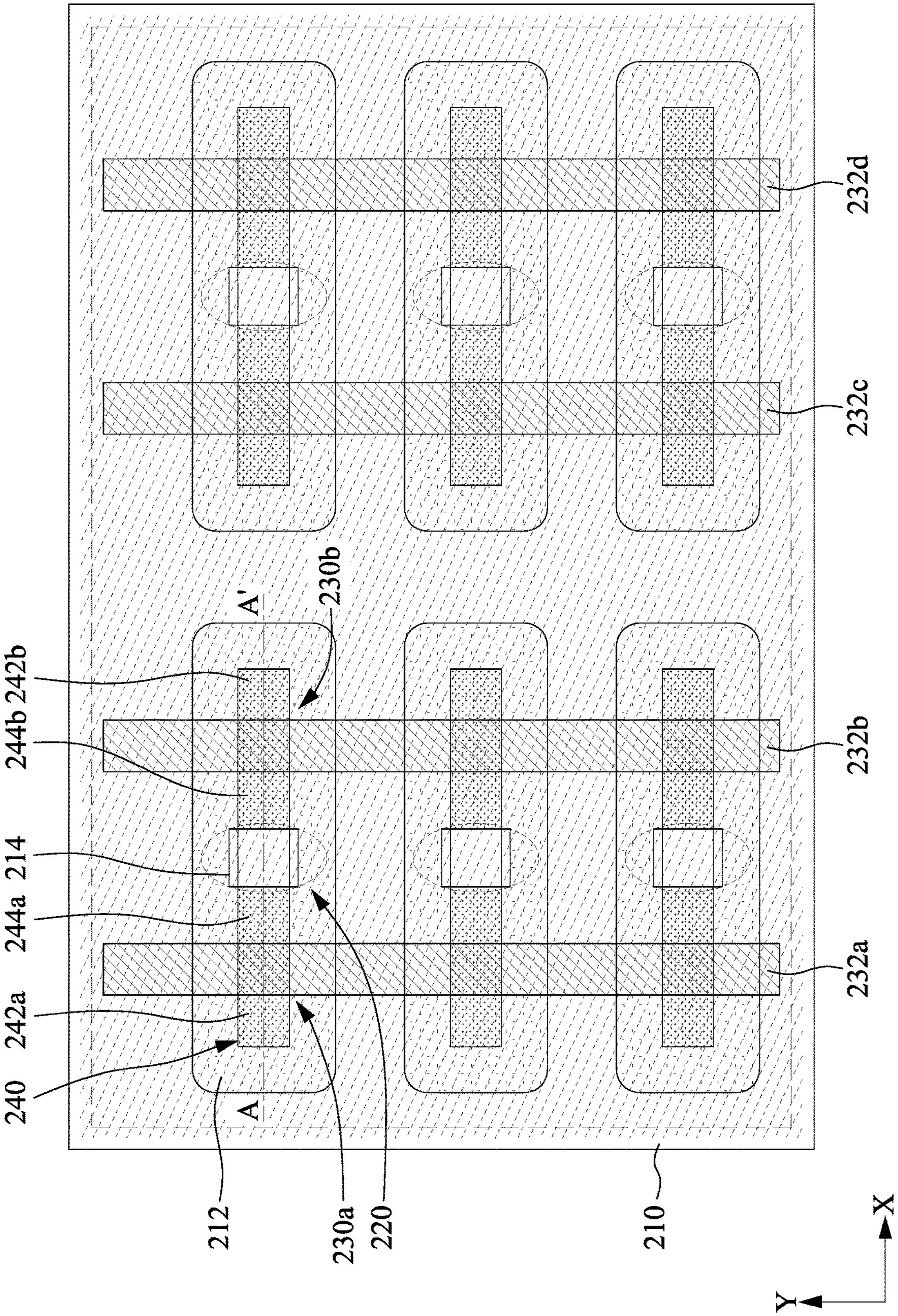
FIG. 11A and FIG. 11B illustrate one or more stages of an exemplary method for manufacturing a semiconductor device structure according to some embodiments of the present disclosure in different perspectives.
Figure 11B:
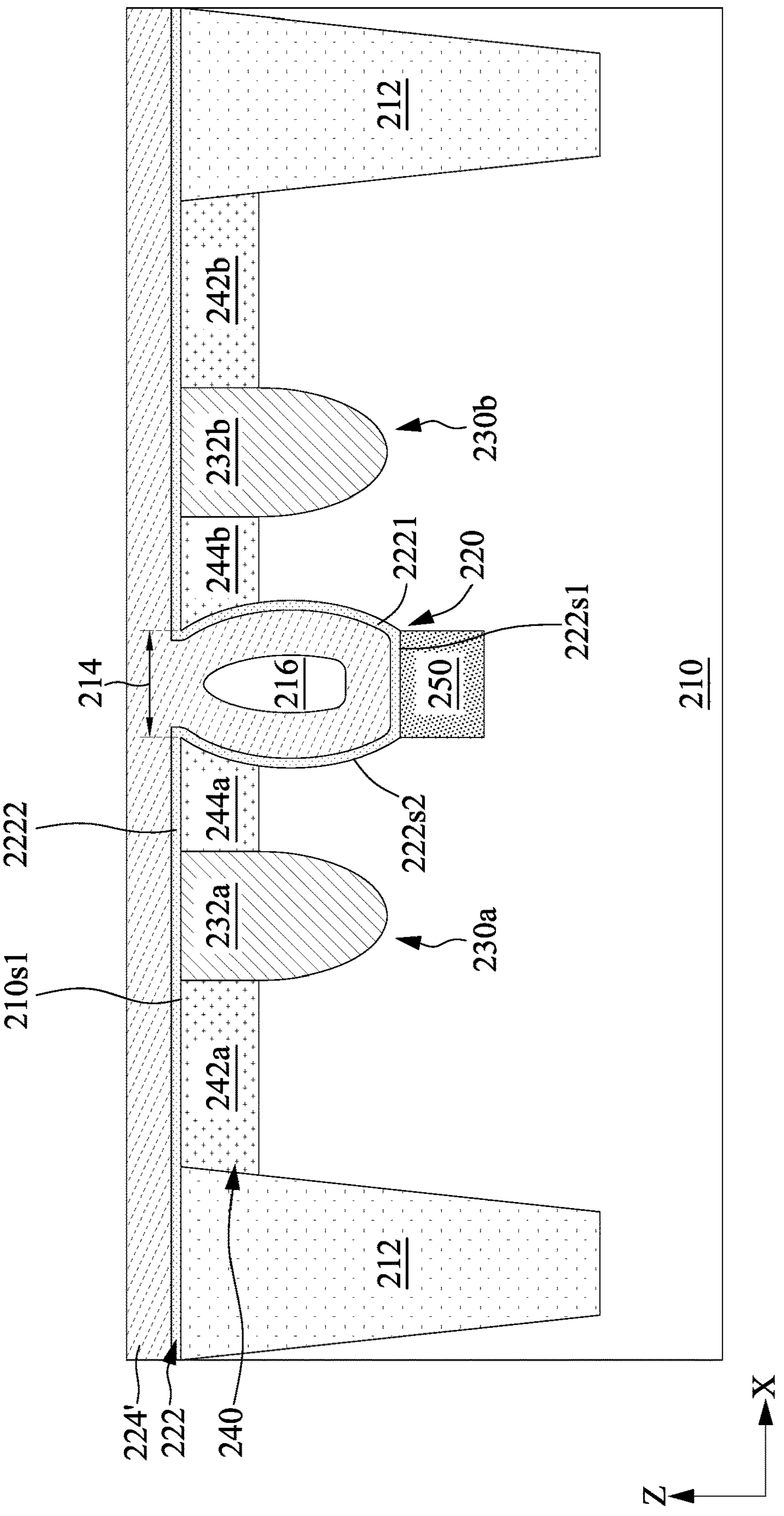

Referring to FIG. 11A and FIG. 11B, a doped region 240 may be formed. In some embodiments, a blanket implantation technique may be performed to form the doped region 240. That is, no reticle(s) or mask(s) are required to form the doped region 240. Therefore, the cost may be reduced. The doped region 240 may include a doped region 242_a_, a doped region 242_b_, a doped region 244_a_, and a doped region 244_b_. The source/drain features of the transistors 230_a_ and 230_b_ may be defined. The channel between the transistor 230_a_ (or transistor 230_b_) and the fuse structure 220 may be defined.

Figure 12A:
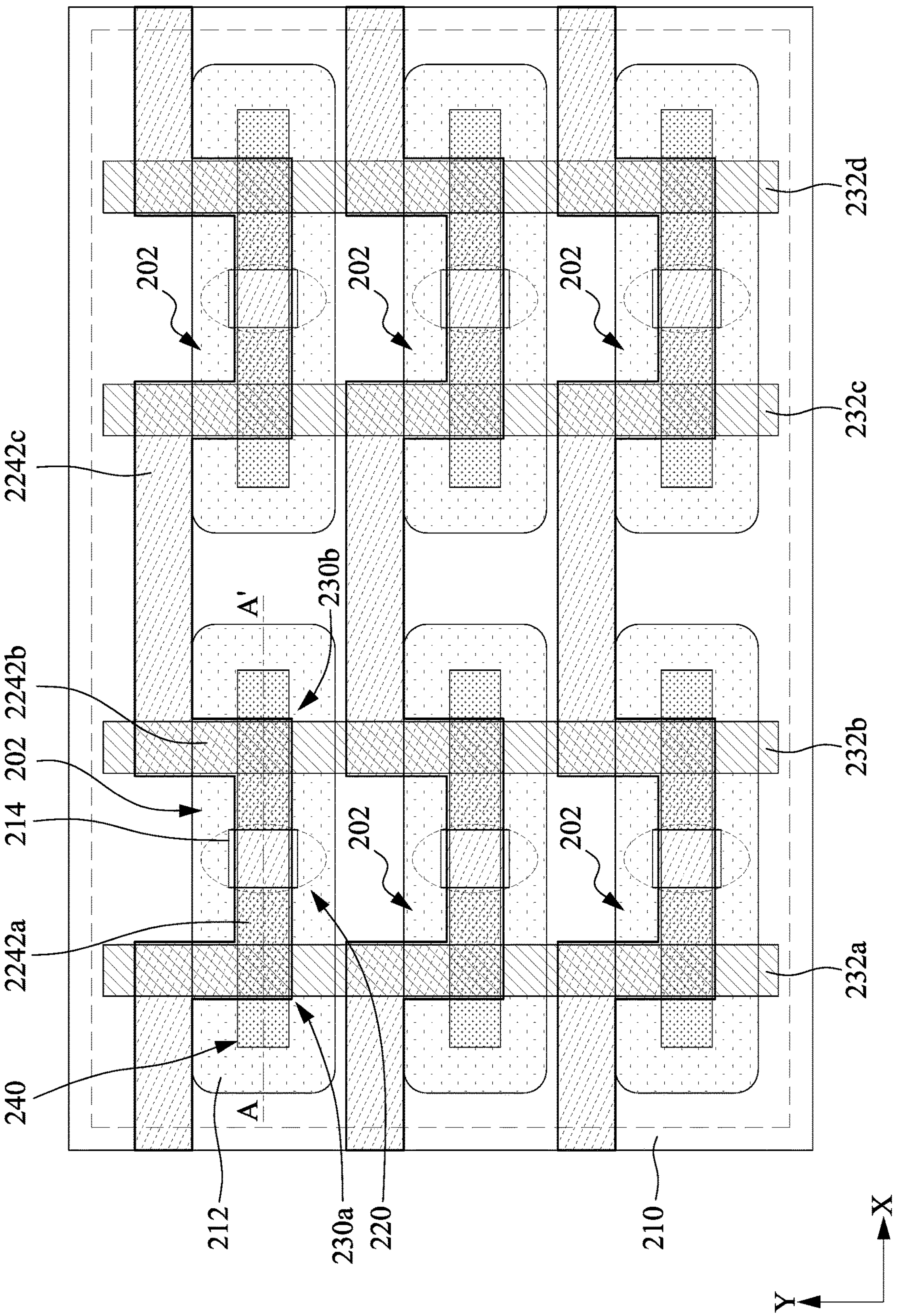
FIG. 12A and FIG. 12B illustrate one or more stages of an exemplary method for manufacturing a semiconductor device structure according to some embodiments of the present disclosure in different perspectives.
Figure 12B:
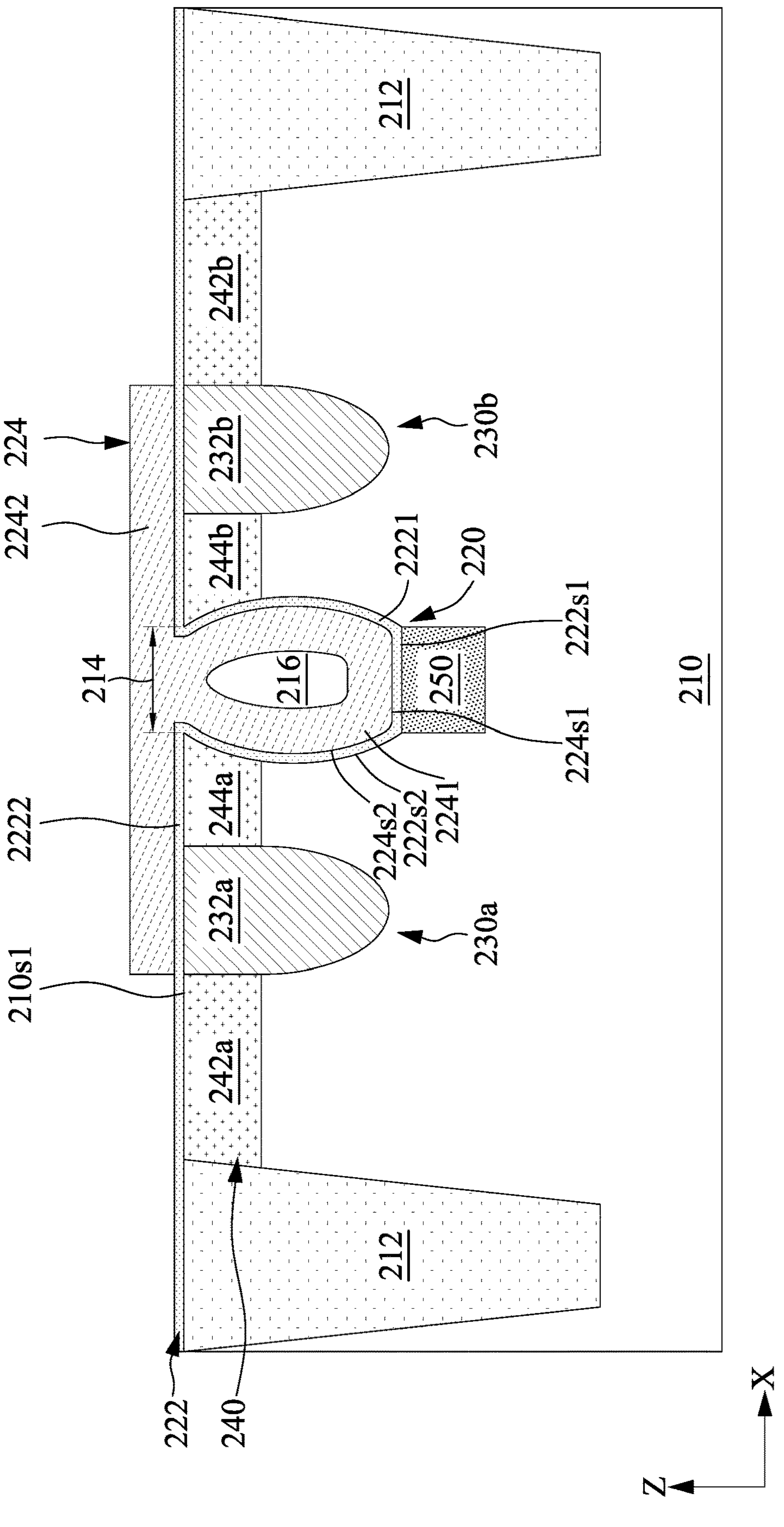

Referring to FIG. 12A and FIG. 12B, the conductive layer 224' may be patterned to define the metallization layer 224. The metallization layer 224 may include a fuse electrode 2241 formed within the opening 214 and a top plate portion 2242 formed over the surface 210_s_1 of the substrate 210. The fuse electrode 2241 may have a surface 224_s_2 protruded toward the word lines 232_a_ and 232_b_. The metallization layer 224 may include a portion 2242_a_ extending between the word lines 232_a_ and 232_b_. The metallization layer 224 may include a portion 2242_b_ parallel to the word lines 232_a_ and 232_b_. The metallization layer 224 may include a portion 2242_c_ parallel to the portion 2242_a_.

Figure 13A:
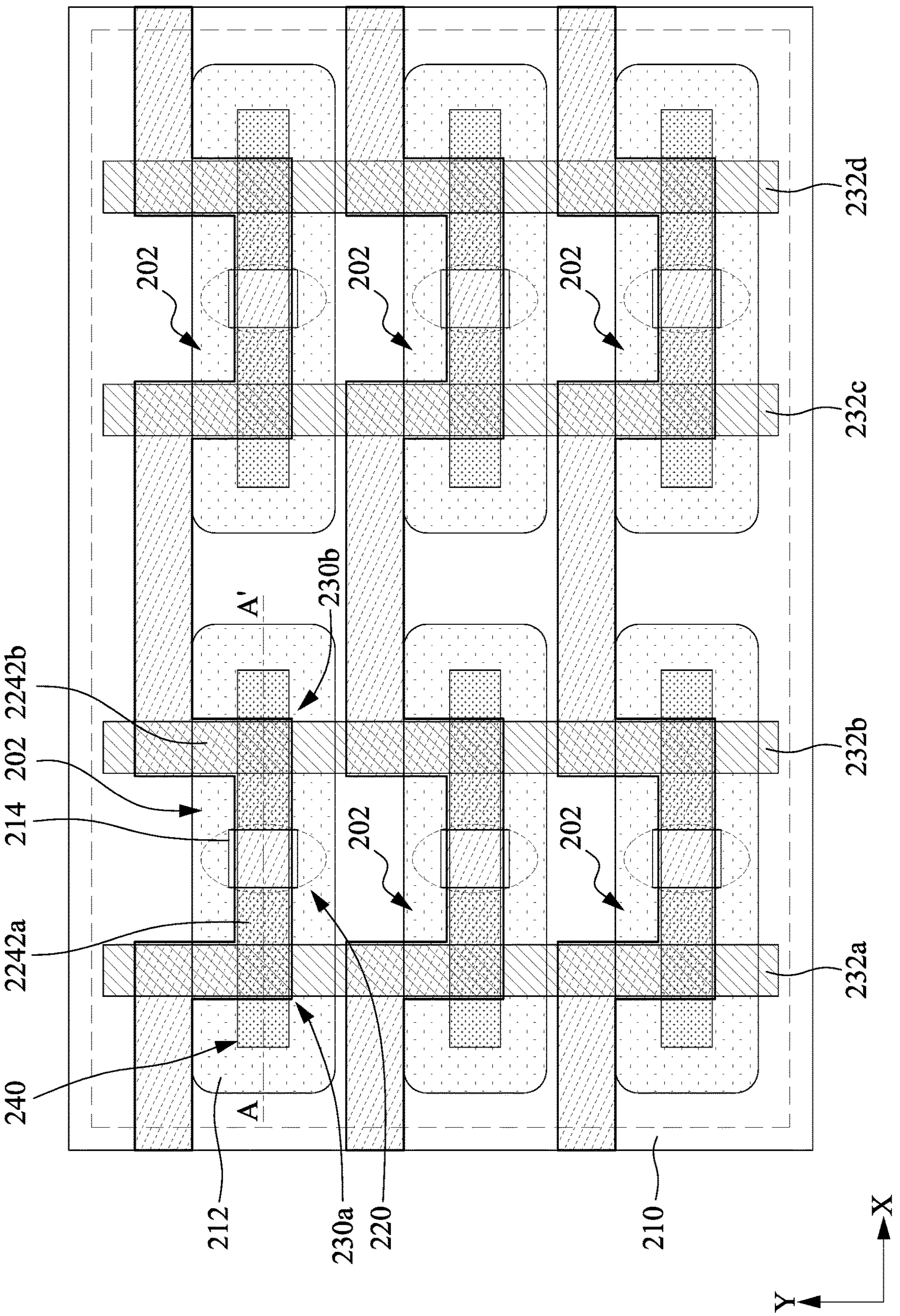
FIG. 13A and FIG. 13B illustrate one or more stages of an exemplary method for manufacturing a semiconductor device structure according to some embodiments of the present disclosure in different perspectives.
Figure 13B:
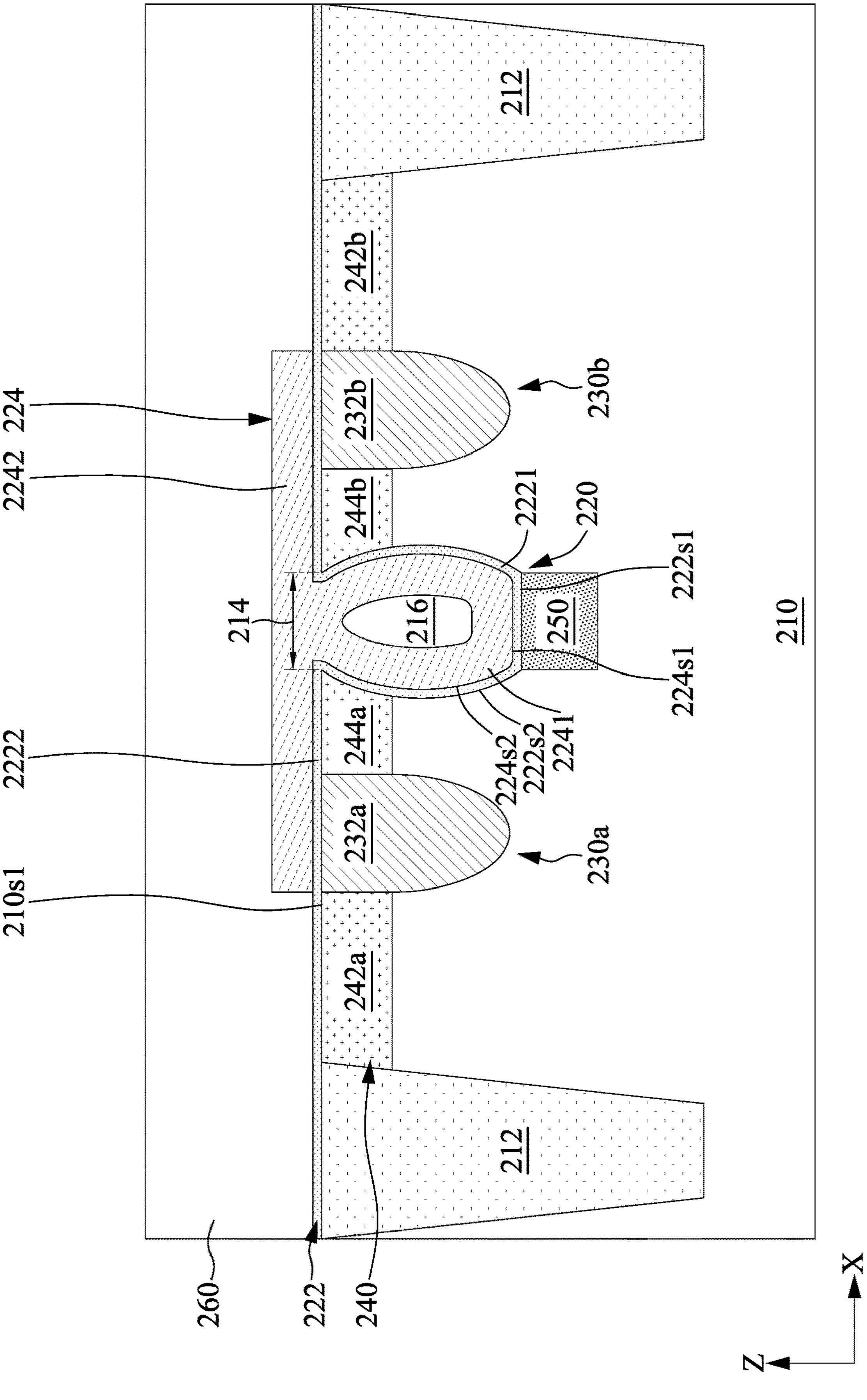

Referring to FIG. 13A and FIG. 13B, a dielectric structure 260 may be formed to cover the substrate 210 and the metallization layer 224. The dielectric structure 260 may be formed by CVD, PVD, ALD, LPCVD, PECVD, or other suitable processes.

Figure 14A:
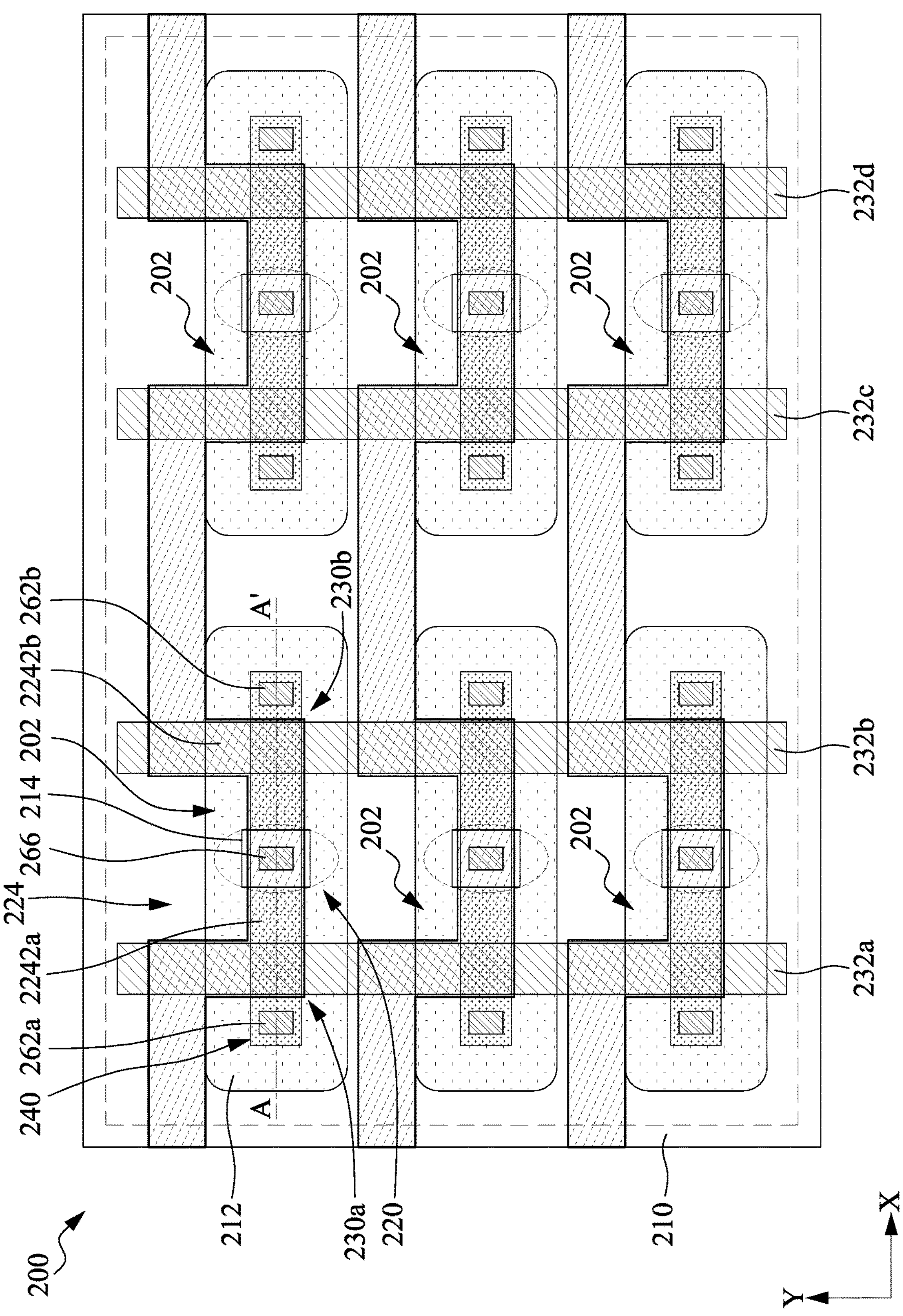
FIG. 14A and FIG. 14B illustrate one or more stages of an exemplary method for manufacturing a semiconductor device structure according to some embodiments of the present disclosure in different perspectives.
Figure 14B:
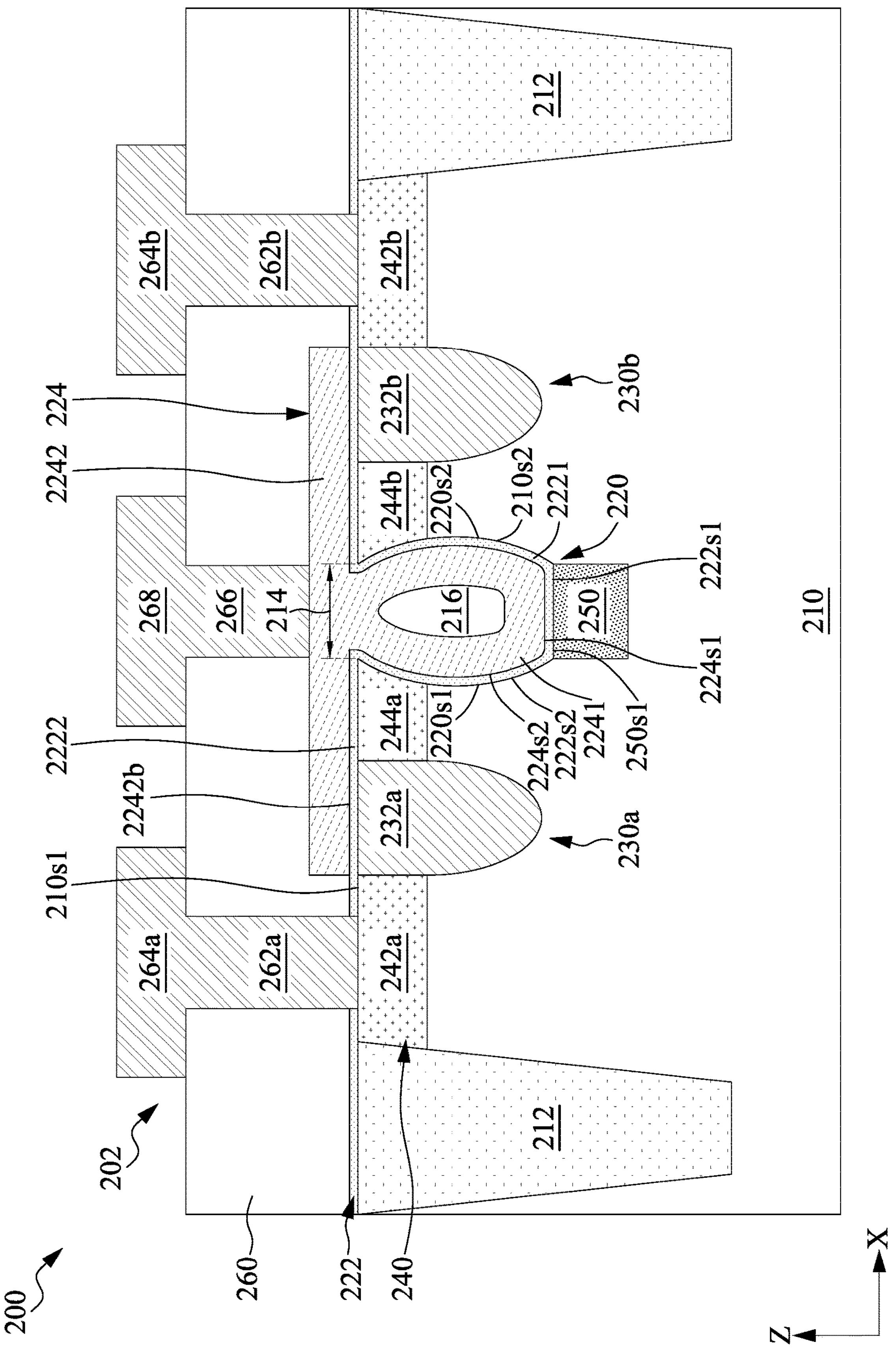

Referring to FIG. 14A and FIG. 14B, a conductive contact 262_a_, a conductive contact 262_b_, a conductive contact 266, a conductive layer 264_a_, a conductive layer 264_b_, and a conductive layer 268 may be formed. As a result, a semiconductor device structure, such as the semiconductor device structure 200 as shown in FIG. 2A and FIG. 2B, may be produced.

One aspect of the present disclosure provides a semiconductor device structure. The semiconductor device structure includes a substrate, a fuse structure, and a first word line. The fuse structure includes a fuse electrode disposed within the substrate. The first word line is electrically coupled to the fuse structure. The first word line is disposed within the substrate and spaced apart from the fuse electrode of the fuse structure. The fuse electrode has a lateral surface protruding toward the first word line.

Another aspect of the present disclosure provides a semiconductor device structure. The semiconductor device structure includes a substrate, a fuse structure, and a first word line. The fuse structure includes a fuse electrode disposed within the substrate. The first word line is electrically coupled to the fuse structure. A distance between the fuse electrode of the fuse structure and the first word line varies along a direction far away from the substrate.

Another aspect of the present disclosure provides a method for manufacturing a semiconductor device structure. The method includes: providing a substrate; forming a first word line and a second word line within the substrate; forming an opening extending from an upper surface of the substrate and between the first word line and the second word line; and forming an insulation layer within the opening; and forming a metallization layer over the insulation layer to define a fuse structure.

The embodiments of the present disclosure provide a semiconductor device structure. The semiconductor device structure includes a substrate, a fuse structure, a first word line, and a second word line. The first word line is electrically coupled with the fuse structure. Further, the first word line and the second word line are electrically coupled in parallel. As a result, a relatively large driving current can be generated. The electrode of the fuse structure has a lateral surface protruded toward the first word line and the second word line. The semiconductor device structure can have a relatively small resistance between the fuse structure and the first word line (or the second word line). Accordingly, the fuse structure can be blown out with a smaller voltage. Although the present disclosure and its advantages have been described in detail, it should be understood that various changes, substitutions and alterations may be made herein without departing from the spirit and scope of the disclosure as defined by the appended claims. For example, many of the processes discussed above may be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, or steps.

It should be noted that, in the description of the present disclosure, an x-y-z coordinate system is assumed where x and y refer to dimensions within the plane parallel to the major surface of the structure and z refers a dimension perpendicular to the plane, two features are topographically aligned or a feature is topographically above another feature when those features have substantially the same x, y coordinates.

It should be noted that, in the description of the present disclosure, the term “about” modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term “about” means within 10% of the reported numerical value. In another aspect, the term “about” means within 5% of the reported numerical value. Yet, in another aspect, the term “about” means within 10, 9, 8, 7, 6, 5, 4, 3, 2, or 1% of the reported numerical value.

It should be noted that, in the description of the present disclosure, some elements (e.g., substrate and first dielectric layer) in the schematic top-view diagrams may be omitted for clarity.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device structure, comprising:

a substrate, wherein the substrate has an opening formed from an upper surface of the substrate, wherein the opening of the substrate has an oval profile defining a curved lateral surface extended from the upper surface of the substrate and a bottom formed below the upper surface of the substrate;

a fuse structure comprising a fuse electrode disposed within the substrate, wherein the fuse electrode is embedded from an upper surface of the substrate; and a first word line electrically coupled to the fuse structure, wherein the first word line is disposed within the substrate and spaced apart from the fuse electrode of the fuse structure, wherein the first word line is embedded from the upper surface of the substrate;

wherein the fuse electrode is disposed within the opening of the substrate;

wherein the fuse electrode has a lower surface at the bottom of the opening, and a lateral surface protruding toward the first word line and along the curved lateral surface of the opening;

wherein the lower surface of the fuse electrode is parallel to the upper surface of the substrate;

wherein the lateral surface of the fuse electrode is extended from the lower surface thereof to the upper surface of the substrate, such that the lateral surface of the fuse electrode is convex surface extended between the lower surface of the fuse electrode and the upper surface of the substrate;

wherein the lower surface of the fuse electrode is a flat surface.

2. The semiconductor device structure of claim 1, wherein the fuse structure comprises a fuse medium separating the fuse electrode from the substrate, and the fuse medium has a lateral surface protruding toward the first word line, wherein a lower surface of the fuse medium is a flat surface;

wherein the lateral surface of the fuse medium is formed between the curved lateral surface of the opening and the lateral surface of the fuse electrode.

3. The semiconductor device structure of claim 1, further comprising:

an air gap surrounded by the fuse electrode, wherein the air gap has an oval-shaped profile.

4. The semiconductor device structure of claim 1, further comprising:

a second word line electrically connected to the fuse structure, wherein the second word line is embedded from the upper surface of the substrate, wherein the fuse electrode is positioned between the first word line and the second word line, wherein the opening is formed between the first word line and the second word line.

5. The semiconductor device structure of claim 4, wherein the first word line is electrically connected to the second word line in parallel.

6. The semiconductor device structure of claim 4, further comprising:

a metallization layer comprising a top plate portion disposed on the substrate and electrically connected to the fuse electrode of the fuse structure, wherein the top plate portion of the metallization layer vertically overlaps the first word line, wherein the top plate portion is integrated with the fuse electrode.

7. The semiconductor device structure of claim 6, wherein the top plate portion of the metallization layer vertically overlaps the second word line.

8. The semiconductor device structure of claim 6, wherein the metallization layer has a first portion extending along a first direction and a second portion extending along a second direction different from the first direction.

9. The semiconductor device structure of claim 1, further comprising:

a block layer disposed under the fuse electrode of the fuse structure, wherein the block layer is disposed below the opening of the substrate, wherein the bottom of the opening is formed on the block layer and is a flat bottom that a width of the bottom of the opening is equal to a width of the block layer.

10. The semiconductor device structure of claim 1, wherein the bottom of the opening is parallel to the upper surface of the substrate.

11. The semiconductor device structure of claim 2, further comprising:

an upper layer integrally extended from the curved lateral surface of the fuse medium and disposed on the upper surface of the substrate;

a doped region disposed within the substrate and between the first word line and the fuse structure, wherein the doped region is in contact with the lateral surface of the fuse electrode and a lateral surface of the first word line, wherein the doped region is covered by the upper layer.

* * * * *